(12) United States Patent
Mikhaylichenko et al.

(10) Patent No.: US 6,733,596 B1
(45) Date of Patent: May 11, 2004

(54) SUBSTRATE CLEANING BRUSH PREPARATION SEQUENCE, METHOD, AND SYSTEM

(75) Inventors: Katrina Mikhaylichenko, San Jose, CA (US); Michael Ravkin, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/328,887

(22) Filed: Dec. 23, 2002

(51) Int. Cl.[7] .............................................. B08B 7/04
(52) U.S. Cl. ................. 134/6; 15/77; 15/88.3; 15/102
(58) Field of Search ............... 134/6, 7, 42, 902; 15/21.1, 77, 88.2, 88.3, 102

(56) References Cited

U.S. PATENT DOCUMENTS 5,860,181 A * 1/1999 Maekawa et al. ............ 15/102
5,861,066 A * 1/1999 Moinpour et al. ............ 134/6
5,868,866 A * 2/1999 Maekawa et al. ............ 134/34
6,033,486 A * 3/2000 Andros ........................ 134/6

* cited by examiner

*Primary Examiner*—Alexander Markoff
*Assistant Examiner*—Saeed Chaudhry
(74) *Attorney, Agent, or Firm*—Martine & Penilla, LLP

(57) ABSTRACT

A method for cleaning top and bottom surfaces of a semiconductor substrate is provided. The method includes scrubbing top and bottom surfaces of the semiconductor wafer with top and bottom brushes, respectively. Top and bottom brushes are saturated and supplied with a scrubbing fluid. The top and bottom brushes are squeezed so as to press out excess scrubbing fluid by continuing to apply top and bottom brushes against top and bottom surfaces of the semiconductor substrate, respectively, but without supplying the scrubbing fluid. Top and bottom brushes are respectively moved away from the top and bottom surfaces of the semiconductor substrate. The top brush is rotated so as to prevent dripping onto the top surface of the semiconductor substrate. Top and bottom surfaces of the semiconductor substrate are rinsed using a rinse fluid while continuing to rotate the top brush that was squeezed to press out the excess scrubbing fluid.

20 Claims, 15 Drawing Sheets

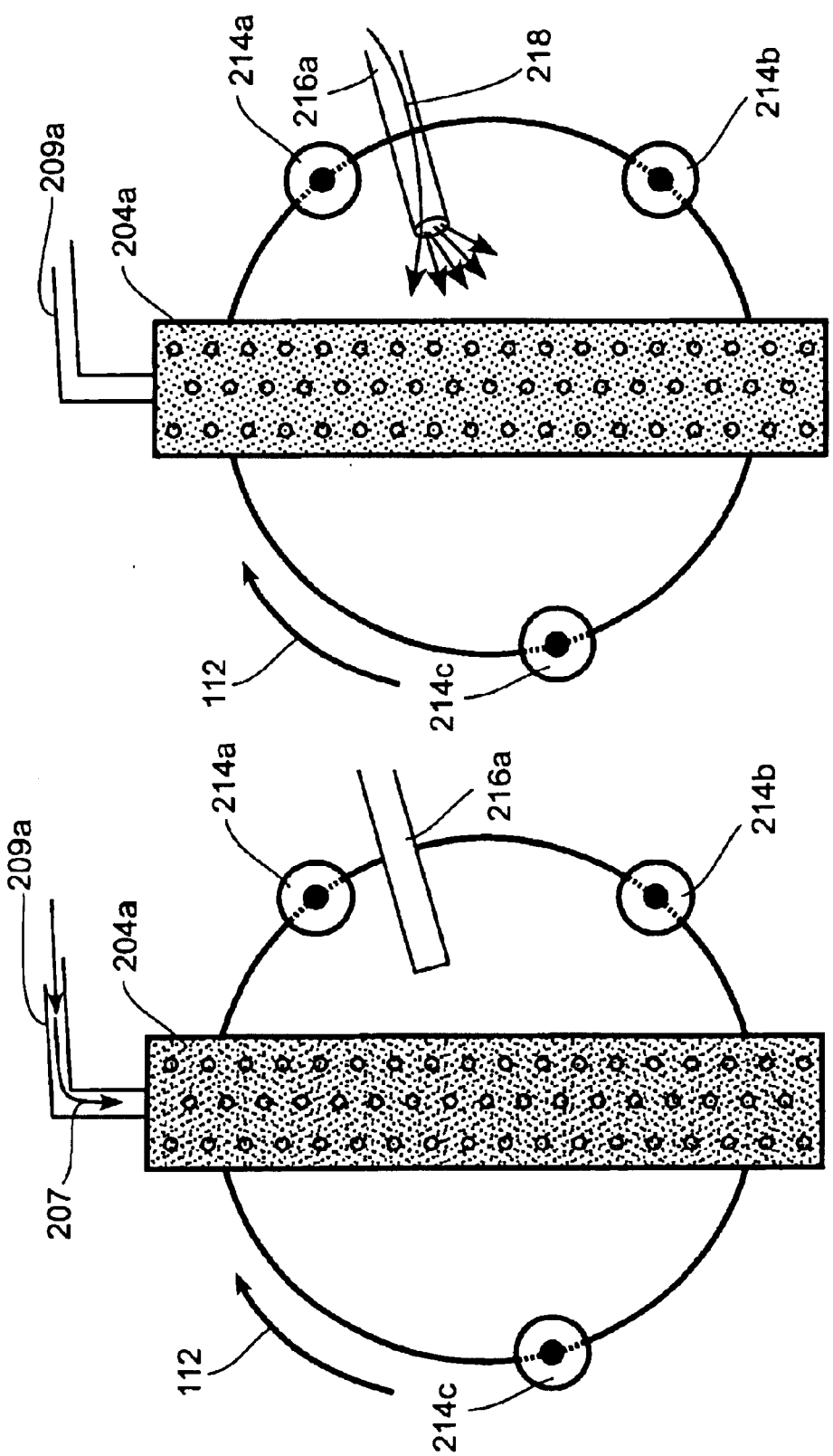

SUBSTRATE CLEANING BRUSH PREPARATION SEQUENCE, METHOD, AND SYSTEM

BACKGROUND OF THE INVENTION

1. Field of the Invention

The present invention relates generally to the fabrication of semiconductor devices and, more particularly, to cleaning semiconductor substrates.

2. Description of the Related Art

As is well known to those skilled in the art, the fabrication of semiconductor devices involves numerous processing operations. These operations include, for example, impurity implants, gate oxide generation, inter-metal oxide depositions, metallization depositions, photolithography patterning, etching operations, chemical mechanical polishing (CMP), etc. Typically, these operations generate contaminants such as particles and residue, which are adhered or absorbed by the wafer surfaces. It is well established that contaminants should be removed from wafer surfaces, as the existence of such contaminants has detrimental effects on the performance of the integrated circuit devices. To achieve this task, wafer surfaces are cleaned as a result of which contaminants such as adhered particles and absorbed compounds (e.g., chemicals) are removed from wafer surfaces.

Normally, double-sided cleaning processing tools are implemented to clean wafer surfaces. FIG. 1 illustrates a cross sectional view of a double-sided horizontal wafer scrubber 100 designed to clean a top surface and bottom surface of a wafer 102, in accordance with the prior art. As shown, the wafer scrubber 100 includes a top brush 104a and a bottom brush 104b, each mounted on a corresponding brush core 106a and bottom brush core 106b. Each of the top brush core 106a and the bottom brush core 106b includes a top shaft 108a and a bottom shaft 108b, each connected to a fluid inlet (not shown in FIG. 1). As shown, the outer surface of top and bottom brushes 104a and 104b are covered with a plurality of nodules 104a and 105b, respectively.

The wafer 102 is shown to be engaged by a pair of rollers 114a and 114b. As can be seen, the wafer 102 is held horizontally by the pair of rollers 114a and 114b and top and bottom brushes 104a and 104b. Top and bottom surfaces of the wafer 102 are scrubbed, respectively, by top and bottom brushes 104a and 104b, which rotate in top and bottom brush rotation directions 110a and 110b, correspondingly. The rollers 114a and 114b rotate while holding the wafer 102, causing the wafer 102 to rotate. The wafer 102 is cleaned as top and bottom brushes 104a and 104b come in contact with top and bottom surfaces of the wafer 102, removing the contaminants.

Normally, each brush core 108a and 108b is connected to a respective fluid inlet designed to supply fluid into the brush cores 108a and 108b. Although not shown, each top and bottom brush core 106a and 106b has a plurality of holes thereon allowing fluid to exit top and bottom brush cores 106a and 106b so as to flush top and bottom brushes 104a and 104b, respectively.

To scrub and rinse wafer top and bottom surfaces thoroughly so as to remove any remaining contaminants, chemicals are initially supplied through the brush (TTB), saturating top and bottom brushes 104a and 104b. Wafer top and bottom surfaces are then scrubbed by top and bottom brushes 104a and 104b for a desired time. Then, top and bottom surfaces of the wafer 102 are rinsed TTB. That is, top and bottom brushes 104a and 104b are flushed and saturated with DI water so as to eliminate scrubbing chemicals in top and bottom brushes 104a and 104b as well as disposing of any contaminant remaining on top and bottom surfaces of the wafer 102. The rinse operation thereafter continues until any and all contaminants remaining on top and bottom surfaces of the wafer have been removed. At this point, the cleaned wafer is removed from the brush scrubber 100, allowing the next wafer to be placed on the rollers 114a and 114b. In this fashion, each wafer is scrubbed and rinsed in the prior art brush scrubber 100.

Repeatedly flushing top and bottom brushes 104a and 104b with chemicals followed by rinsing of the chemicals out of top and bottom brushes 104a and 104b using de-ionized water is not without negative consequences. For instance, a significant amount of chemicals is wasted during each and every brush scrubbing operation. The brushes are saturated with chemicals to perform the scrubbing operation. Immediately thereafter the brushes are rinsed with DI water, ultimately resulting in wasting a substantial amount of chemicals, overall. In addition to wasting chemicals, the pH of top and bottom brushes 104a and 104b is repeatedly and constantly oscillating, undesirably creating a constant non-equilibrium in top and bottom brushes 104a and 104b.

Another negative effect of TTB scrubbing and rinse operation is reintroduction of contaminants onto the wafer top and bottom surfaces. For instance, residues remaining in top and bottom brushes are re-introduced into the rinsing interface by the rinse fluid applied TTB. Additionally, chemicals in top brush drip on to the top surface of the wafer, recontaminating the wafer top surface having the active components, damaging the wafers and significantly reduce wafer throughput.

In view of the foregoing, there is a need for an improved semiconductor processing apparatus and methodology capable of minimizing wasting of chemicals during cleaning operation while increasing wafer throughput through preventing recontamination of wafer surfaces.

SUMMARY OF THE INVENTION

Broadly speaking, the present invention fills these needs by providing an apparatus and methodology capable of substantially minimizing fluids used during substrate cleaning operations while increasing wafer throughput. In one embodiment, top and bottom surfaces of the wafers are cleaned in a brush scrubber-rinse module. In one embodiment, top and bottom brushes of the brush scrubber-rinse module saturated with scrubbing fluid are implemented to scrub wafer top and bottom surfaces through the brush (TTB). Top and bottom brushes are squeezed, eliminating excess scrubbing fluid. Top and bottom surfaces of the wafer are then rinsed using a rinse fluid introduced onto the wafer top and bottom surfaces through respective rinse nozzles.

It should be appreciated that the present invention can be implemented in numerous ways, including as a process, an apparatus, a system, a device, or a method. Several inventive embodiments of the present invention are described below.

In one embodiment, a method for cleaning top and bottom surfaces of a semiconductor substrate is provided. The method includes scrubbing a top surface of the semiconductor wafer with a top brush and a bottom surface of the semiconductor substrate with a bottom brush. The top brush and the bottom brush are saturated and supplied with a scrubbing fluid. The method also includes squeezing the top brush and the bottom brush so as to press out excess scrubbing fluid by continuing to apply the top brush against the top surface and the bottom brush against the bottom surface of the semiconductor substrate, but without supplying the scrubbing fluid. The method further includes moving the top brush away from the top surface of the semiconductor substrate and the bottom brush from the bottom surface of the semiconductor substrate. Also included is rotating the top brush to prevent dripping onto the top surface of the semiconductor substrate. The method also includes rinsing the top and bottom surfaces of the semiconductor substrate using a rinse fluid while continuing to rotate the top brush that was squeezed to press out the excess scrubbing fluid.

In another embodiment, a method for cleaning a semiconductor substrate is provided. The method includes scrubbing a top surface of the semiconductor substrate with a top brush and a bottom surface of the semiconductor substrate with a bottom brush. The top brush and the bottom brush are saturated with a scrubbing fluid. Also included is squeezing the top brush and the bottom brush so as to press out excess scrubbing fluid. The method further includes moving the top brush away from the top surface of the semiconductor substrate and the bottom brush from the bottom surface of the semiconductor substrate while rotating the top brush. Further included in the method is rinsing top and bottom surfaces of the semiconductor substrate using a rinse fluid.

In yet another embodiment, a method for cleaning top and bottom surfaces of a semiconductor substrate is provided. The method includes scrubbing a top surface of the semiconductor substrate with a top brush and a bottom surface of the semiconductor substrate with a bottom brush. The top brush and the bottom brush are saturated and supplied with a scrubbing fluid. The method also includes squeezing the top brush and the bottom brush so as to press out excess scrubbing fluid by continuing to apply the top brush against the top surface and the bottom brush against the bottom surface of the semiconductor substrate, but without supplying the scrubbing fluid. Also included in the method is moving the top brush to a side of the top surface of the semiconductor substrate and moving the bottom brush away from the bottom surface of the semiconductor substrate to prevent dripping onto the top surface of the semiconductor substrate. Also included is rinsing the top and bottom surfaces of the semiconductor substrate using a rinse fluid.

In still a further embodiment, a method for cleaning top and bottom surfaces of a semiconductor substrate is provided. The method includes scrubbing a top surface of the semiconductor wafer with a top brush and a bottom surface of the semiconductor substrate with a bottom brush. The top brush and the bottom brush are saturated with a scrubbing fluid. The method also includes squeezing the top brush and the bottom brush so as to press out excess scrubbing fluid. Also included is moving the top brush away from the top surface of the semiconductor substrate and the bottom brush from the bottom surface of the semiconductor substrate while rotating the top brush. Further included in the method is rinsing the top and bottom surfaces of the semiconductor substrate using a rinse fluid.

The advantages of the present invention are numerous. Most notably, in contrast to the double-sided wafer scrubbers of the prior art in which cleaning fluid and rinsing fluid are introduced into the cleaning interface through the brush (TTB), the embodiment of the present invention introduce scrubbing fluid to the cleaning interface TTB during the scrubbing operation. However, top and bottom surfaces of the wafer are rinsed using rinse fluid delivered onto the wafer surfaces using rinse nozzles. In this manner, there is substantially no need to flush out the scrubbing fluid in the brushes before performing the rinse operation. Another advantage of the embodiments of the present invention is that the concentration of scrubbing chemicals in the brushes are remained substantially constant. Still another advantage of the present invention is that the overall use of chemicals during the cleaning operation is substantially reduced. Yet another advantage of the embodiments of the present invention is that the scrubbing and rinse operations are performed in a single module. Still another advantage is that the embodiments of the present invention substantially eliminate the possibility of recontamination of the wafer surfaces through dripping of scrubbing liquid. Yet another advantage is that the embodiments of the present invention substantially prevent introduction of contaminants remaining in the brushes onto the wafer surfaces.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 2B is a simplified top view depicting scrubbing of a top surface of a wafer in an exemplary horizontal double-sided brush scrubber-rinse module, in accordance with one embodiment of the present invention.

FIG. 2C is a simplified top view depicting rinsing of a top surface of a wafer in an exemplary horizontal double-sided brush scrubber-rinse module, in accordance with still another embodiment of the present invention.

DETAILED DESCRIPTION OF THE PREFERRED EMBODIMENTS

An invention capable of substantially minimizing fluids implemented during a cleaning operation while increasing wafer throughput by preventing recontamination of wafer surfaces is provided. In one embodiment, a brush scrubber-rinse module for cleaning wafer top and bottom surfaces is provided. In one preferred embodiment, top and bottom brushes of the brush scrubber-rinse module are saturated with scrubbing fluid. Top and bottom brushes are implemented to scrub wafer top and bottom surfaces using scrubbing fluid introduced into a scrubbing interface through the brush (TTB). Supplying of scrubbing fluid is ceased while top and bottom brushes are still being applied to wafer top and bottom surfaces, squeezing excess scrubbing fluid out of top and bottom brushes. In one exemplary embodiment, top and bottom brushes are moved away from wafer top and bottom surfaces. In another example, top and bottom brushes are configured to continue rotating until excess scrubbing fluid is pressed out of top and bottom brushes. In yet another example, the top brush is configured to continue rotating until excess scrubbing fluid has been eliminated from the top brush while the bottom brush is remained stationary, preventing recontamination of wafer top surface. In still another embodiment, the top brush is moved to a side of the wafer top surface such that any dripping of scrubbing fluid onto wafer top surface is prevented.

Wafer top and bottom surfaces are then rinsed using rinse fluid directed onto approximately centers of wafer top and bottom surfaces through top and bottom nozzles. Preferably, rinse fluid is applied onto wafer top and bottom surfaces such that a rinse fluid main stream is substantially directed at respective centers of wafer top and bottom surfaces. In this manner, the rinse fluid is prevented from diluting the concentration of the scrubbing fluid in top and bottom brushes.

Figure 1:
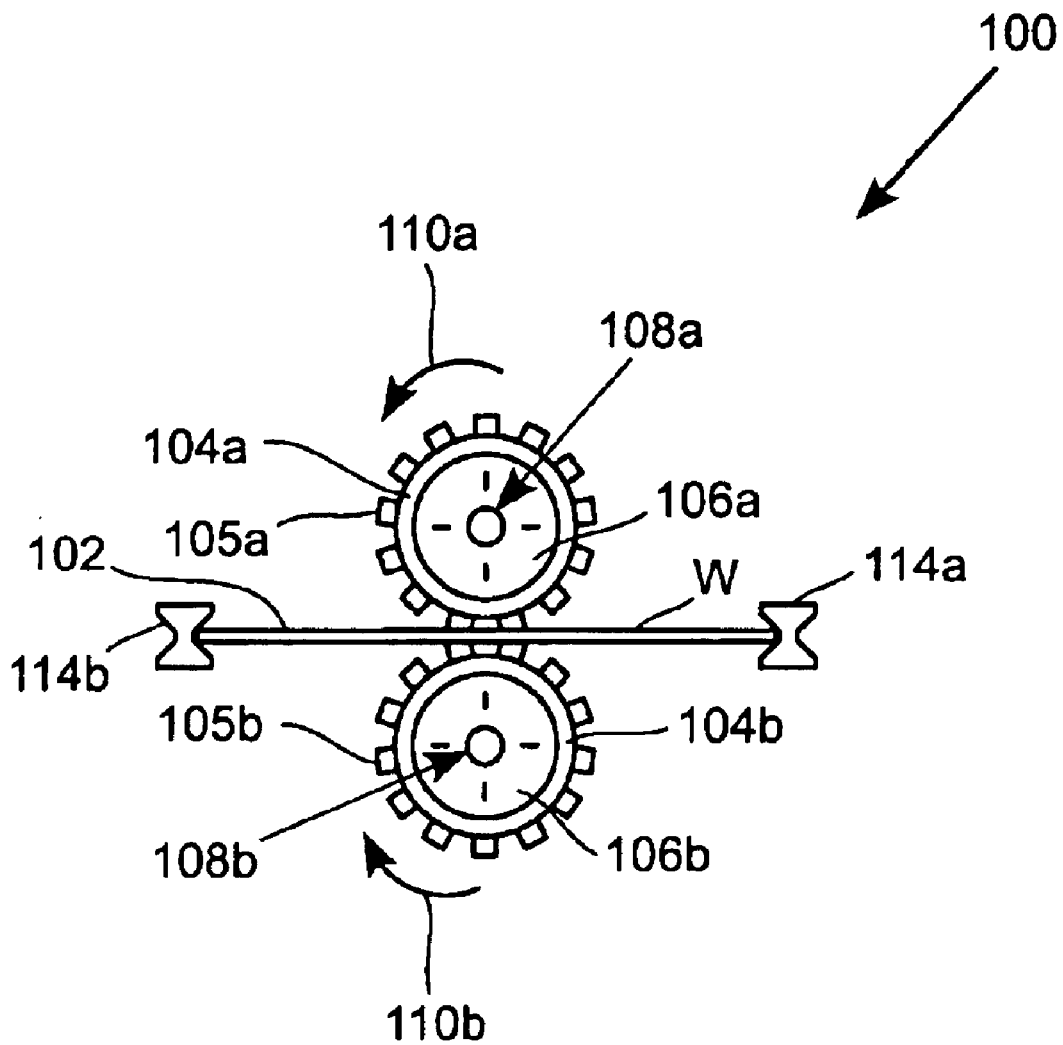
FIG. 1 is a simplified cross-sectional view of a prior art horizontal wafer scrubber.

In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention. FIG. 1 was discussed above in the "Background of the Invention" section. It should be appreciated that the term "about" as used herein, refers to a range of +/−10%.

Figure 2A:
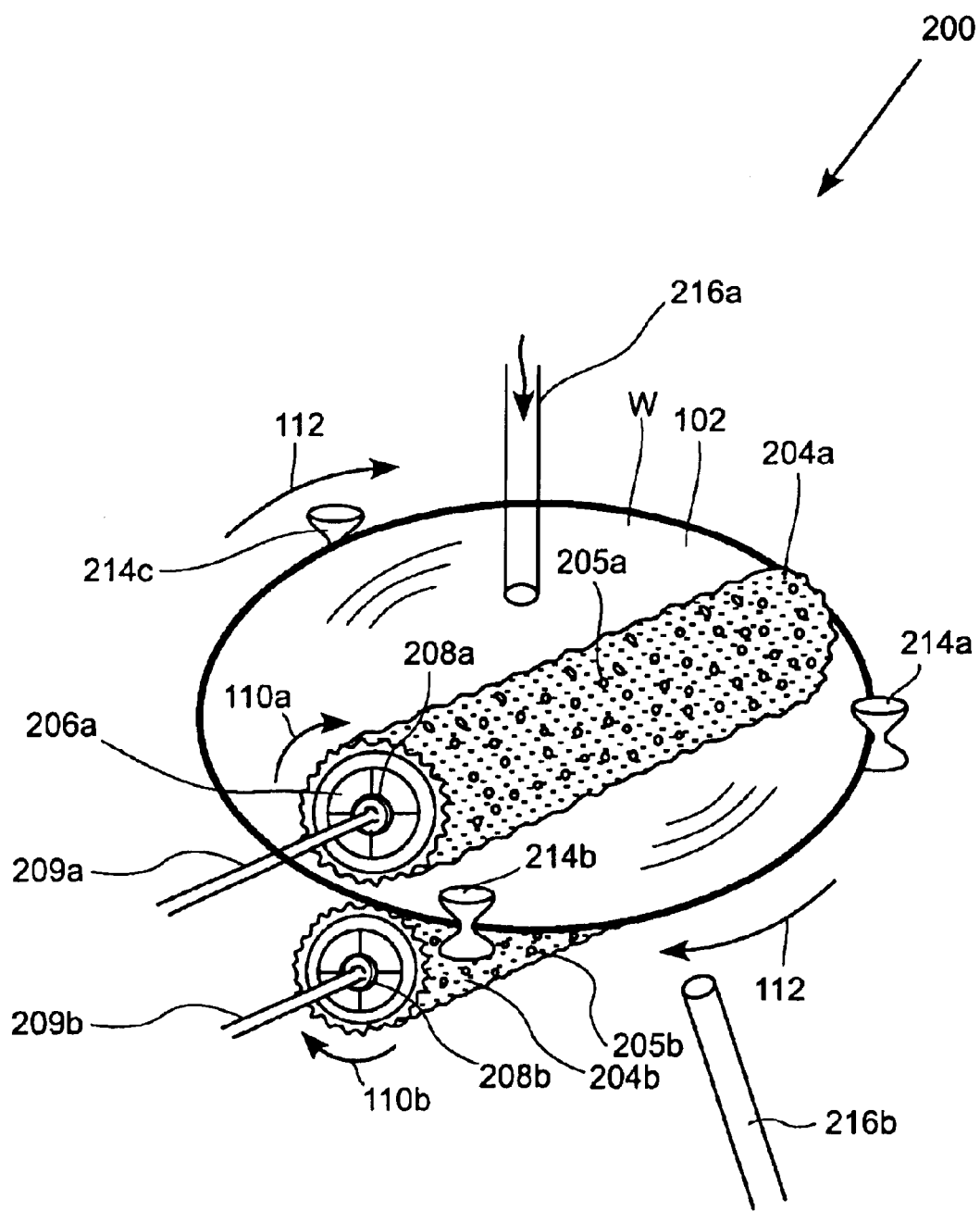
FIG. 2A is a simplified three-dimensional view of an exemplary double-sided brush scrubber-rinse module, in accordance with one embodiment of the present invention.

FIG. 2A is a simplified three-dimensional view of an exemplary double-sided wafer brush scrubber-rinse module 200, in accordance with one embodiment of the present invention. As shown, the wafer scrubber-rinse module 200 includes a top brush 204a and a bottom brush 204b, each of which is mounted on a corresponding brush core 206a and bottom brush core 206b. Each of the top brush core 206a and the bottom brush core 206b includes a top shaft 208a and a bottom shaft 208b, each connected to a top fluid inlet 209a and a bottom fluid inlet 209b. As shown, the outer surface of top and bottom brushes 204a and 204b are covered with a plurality of nodules 204a and 205b, respectively. Top and bottom surfaces of the wafer 102 are configured to be scrubbed by: the corresponding top and bottom brushes 204a and 204b and subsequently rinsed using respective top and bottom rinse nozzles 216a and 216b.

The wafer 102 is shown to be engaged by two engaging rollers 214a and 214b and a driving roller 214c. As can be seen, during the scrubbing operation, the wafer 102 is held horizontally by the engaging rollers 214a and 214b and the driving roller 214b and top and bottom brushes 204a and 204b. The wafer 102 is rotated in a wafer rotation direction 112 by the driving roller 214c. Additional information regarding the mechanism of the driving roller 214c and the engaging rollers 214a during the scrubbing and rinse operations is provided below with respect to FIGS. 2B–2C. As can be seen, top and bottom brushes 204a and 204b are configured to rotate around an axis of rotation in respective rotation directions 110a and 110b. In this manner, top and bottom surfaces of the wafer 102 are cleaned as top and bottom brushes 204a and 204b come into contact with top and bottom surfaces of the wafer 102.

In one embodiment, top and bottom brushes 204a and 204b are polyvinyl alcohol (PVA) brushes (i.e., a very soft sponge), which can dislodge contaminants such as particles and residues using the scrubbing fluid 207. In must be noted, however, that in another example, top and bottom brushes 204a and 204b can be constructed from any suitable material so long as the material can dislodge particles and residues remaining on top and bottom surfaces of the wafer.

With continued reference to FIG. 2A, the wafer 102 is shown to rotate in the wafer rotation direction 112 while top and bottom brushes 204a and 204b rotate in the corresponding rotation direction 110a and 110b and apply equal but opposite forces to the wafer top and bottom surfaces.

Top and bottom brush cores 206a and 206b arc shown to be connected to respective top and bottom fluid inlets 209a and 209b designed to supply scrubbing fluid into the brush cores 208a and 208b. Each top and bottom brush core 206a and 206b has a plurality of holes thereon (not shown in this FIG,) allowing the scrubbing fluid 207 to exit top and bottom brush cores 206a and 206b, saturating top and bottom brushes 204a and 204b, respectively. In this manner, scrubbing fluid 207 is introduced into the scrubbing interface, allowing top and bottom surfaces of the wafer be scrubbed and cleaned. In one embodiment, top and bottom surfaces of the wafer 102 are scrubbed using de-ionized water or any aqueous or semi-aqueous chemical solution. It must be appreciated by one having ordinary skill in the art that the scrubbing fluid 207 can be any suitable fluid capable of cleaning top and bottom surfaces of the wafer (e.g., Standard Cleaning I (SCI), DI water, ammonia containing chemical mixtures, HF containing chemical mixtures, surfactant containing chemical mixtures, etc.) In one implementation, the scrubbing fluid may be a cleaning fluid as described in U.S. Pat. No. 6,405,399, issued on Jun. 18, 2002, having inventors Jeffrey J. Farber and Julia S. Svirchevski, and entitled "Method and System of Cleaning a Wafer After Chemical Mechanical Polishing or Plasma Processing." This U.S. Patent, which is assigned to Lam Research Corporation, the assignee of the subject application, is incorporated herein by reference.

As can be seen, the wafer scrubber-rinse module 200 of the present invention further includes top and bottom rinse nozzles 216a and 216b. Top and bottom rinse nozzles 216a and 216b arc defined within the module such that rinse steam 218' is, substantially directed to the respective centers of top and bottom surfaces of the wafer 102. Additional information regarding the rinse operation using top and bottom rinse nozzles 216a and 216b are provided below.

Reference is made to the simplified top view diagrams depicted in FIGS. 2B and 2C, respectively, showing scrubbing and rinsing of an exemplary top surface of the wafer 102 in a double-sided brush scrubber-rinse module 200, in accordance with one embodiment of the present invention. As can be seen in FIG. 2B, the wafer 102 is engaged by the engaging rollers 214a and 214b and the driving roller 214c. In one embodiment, the driving roller 214c is configured to cause the wafer 102 to rotate in the rotation direction 112 while the driving roller still engages the wafer 102. In another embodiment, rollers 214a, 214b, and 214c can be configured to be implemented to cause the wafer 102 to rotate in the rotation direction 112.

As further shown, during the scrubbing operation, top and bottom brushes 204a and 204b are brought into contact with the wafer 102 as the top and bottom brushes 204a and 204b are being flushed with scrubbing fluid 207 through top and bottom fluid inlets 208a and 208b, respectively. Thus, during the scrubbing operation, the wafer 102 is also being held horizontally by top and bottom brushes 204a and 204b. As can be seen in FIG. 2B, the top nozzle 216a is defined within the module such that rinse fluid is directed substantially toward the center of the wafer top surface. However, as can be seen, no rinse fluid is being supplied during the scrubbing operation.

FIG. 2C, comparatively, shows the top surface of the wafer 102 being rinsed by rinse fluid 218 being introduced through the top nozzle 216a. As can be seen, the supplying of the scrubbing fluid 207 has seized and the rinse fluid spray stream 218' is directed toward the center of the wafer top surface. In this matter, the centrifugal force generated by the rotation of the wafer 102 causes the rinse fluid 218 to be spread over the top wafer surface, cleaning the top wafer surface. As will be discussed in more detail with respect to FIG. 3B, the top brush 204a shown in the embodiment of FIG. 2C no longer is in contact with the wafer top surface.

Figure 3A:
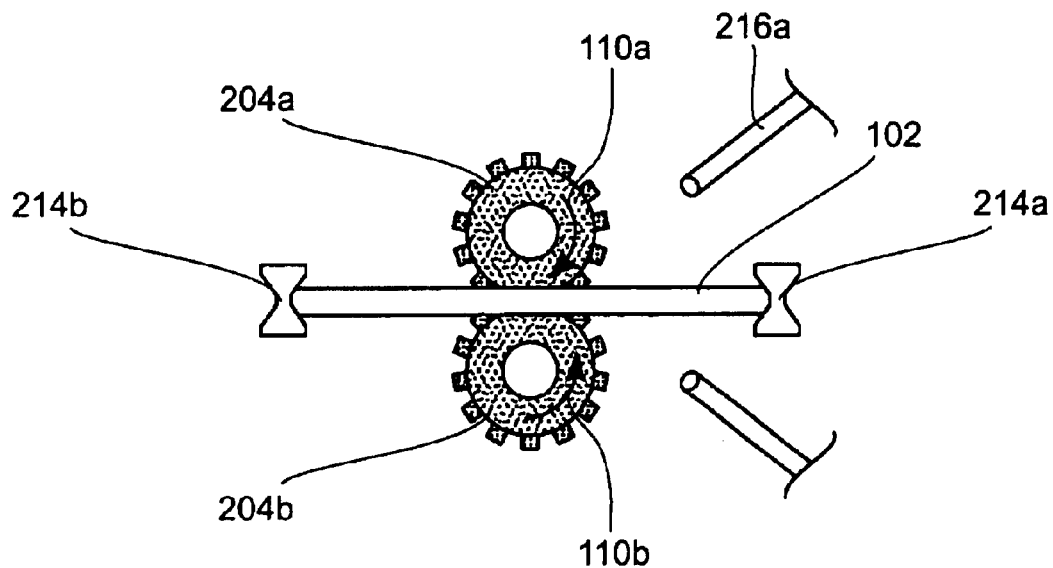
FIG. 3A is a simplified, exploded, cross sectional view depicting scrubbing of top and bottom surfaces of the wafer in an exemplary double-sided scrubber-rinse module, in accordance with still another embodiment of the present invention.
Figure 3B:
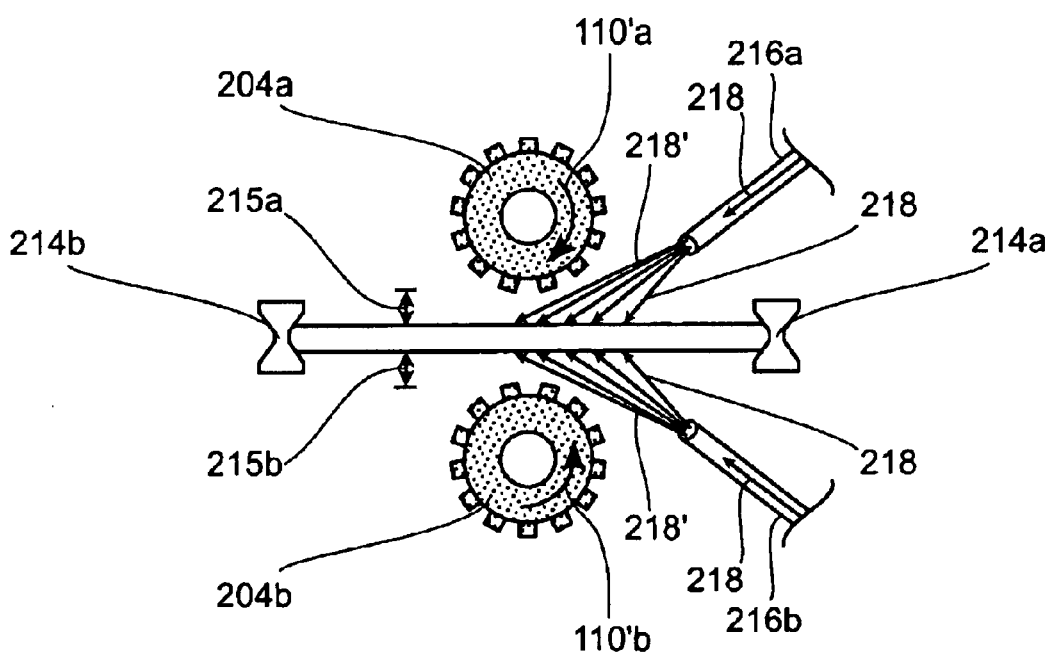
FIG. 3B is a simplified, exploded, cross sectional view depicting rinsing of top and bottom surfaces of the wafer in an exemplary double-sided scrubber-rinse module, in accordance with still another embodiment of the present invention.

FIGS. 3A and 3B are simplified cross sectional views of an exemplary double-sided scrubber-rinse module, in accordance with one embodiment of the present invention. As shown in FIG. 3A, top and bottom brushes 204a and 204b come into contact with top and bottom surfaces of the wafer 102, as top and bottom brushes 204a and 204b are respectively rotating in top and bottom rotation directions 110a and 110b. As can been seen, the wafer 102 is held horizontally by the engaging wafers 214a and 214b and driving roller 214c (not shown in this figure) while top and bottom brushes 204a and 204 hold the wafer 102. Top and bottom brushes 204a and 204b respectively apply equal but opposite pressure to top and bottom surfaces of the wafer 102, as can be seen by the suppression of top and bottom brushes 204a and 204b.

During the scrubbing operation, top and bottom brushes 204a and 204b are flushed with scrubbing fluid 207, saturating top and bottom brushes 204a and 204b with scrubbing fluid 207. As can be seen, no rinse fluid is being supplied during the scrub operation. In one embodiment, top and bottom brushes 204a and 204b are configured to rotate between approximately about 100 and 400 RPMs, and a more preferred range of approximately about 200 and 400 RPMs and most preferably approximately about 200–250 RPMs during the rinse operation.

In one example, once the wafer 102 has been scrubbed for a desired amount of time, supplying of the scrubbing fluid is stopped. The application of the rotating top and bottom brushes 204a and 204b to top and bottom surfaces of the wafer 102, however, still continues. In this manner, any excess scrubbing fluid 207 saturating top and bottom brushes 204a and 204b is squeezed out of top and bottom brushes 204a and 204b. As can be seen, top and bottom brushes 204a and 204b are still rotating in, rotation directions 110a and 110b, respectively, during the squeezing operation. The squeezing operation advantageously prevents dripping of scrubbing fluid 207, which naturally occurs when top and bottom brushes 204a and 204b are saturated with fluid.

The embodiment shown in FIG. 3B depicts top and bottom surfaces of the wafer 102 being rinsed using the rinse fluid 218 introduced through the respective top and bottom nozzles 216a and 216b. As can be seen, top and bottom brushes 204a and 204b are no longer saturated with the scrubbing fluid 207a and 207b, respectively. In one example, after the scrubbing operation has concluded, the scrubbing of top and bottom surfaces of the wafer by top and bottom brushes 204a and 204b is continued until a percentage of the scrubbing fluid is pressed out of top and bottom brushes 204a and 204b.

As can be seen in FIG. 3B, while the wafer 102 is still engaged by the engaging rollers 214a and 214b and the driving roller 214c, the wafer 102 is no longer in contact with top and bottom brushes 204a and 204b. Top and bottom brushes 204a and 204b are shown to have been moved away from the respective top and bottom surfaces of the wafer 102.

Specifically, the top brush 204a has been moved above the top surface of the wafer 102 such that a distance 215a has been created between the lowermost portion of the top brush 204a and the wafer top surface. In a like manner, the bottom brush 204b is moved below the bottom surface of the wafer 102 for a distance of 215b. As shown, the topmost portion of the bottom brush 204b is shown to have a distance 215b from the wafer bottom surface.

In the embodiment shown in FIG. 3B, top and bottom brushes 204a and 204b are shown to be rotating in rotation directions 110a' and 110b'. In one embodiment, the top brush 204a may continue rotating so as to prevent the scrubbing fluid remaining in the top brush 204a from being reintroduced into the rinse interface. Thus, in one preferred embodiment, the scrubbing fluid in the bottom brush 204b may be allowed to drip, because any scrubbing fluid droplets cannot be dripped onto the wafer bottom surface.

By way of example, top and bottom brushes 204a and 204b can be configured to rotate between approximately about 2 and 60 RPMs, and a more preferred range of approximately about 10 and 60 RPMs and most preferably approximately about 20 RPMs during the rinse operation.

Subsequent to moving top and bottom brushes 204a and 204b above and below top and bottom surfaces of the wafer, rinsing top and bottom surfaces of the wafer 102 is initiated. As can be seen, rinse fluid 218 is shown to be introduced onto the wafer top and bottom surfaces using top and bottom rinse nozzles 216a and 216b. Rinse fluid spray stream 218' is shown to be directed onto respective centers of top and bottom surfaces of the wafer 102. However, the rinse fluid spray stream 218' is shown to be applied onto the wafer top and bottom surfaces without contacting top and bottom brushes 204a and 204b. This is possible due to the distances 215a and 215b defined between top and bottom brushes 204a and 204b and top and bottom surfaces of the wafer 102, respectively. As can be appreciated, defining top and bottom rinse nozzles 216a and 216b such that a rinse fluid main stream cannot come into contact with top and bottom brushes 204a and 2104b is beneficial as the concentration of the scrubbing fluid 207 in top and bottom brushes 204a and 204b remains substantially consistent. The concentration remains substantially the same as there does not exist the necessity to rinse out top and bottom brushes 204a and 204b prior to the rinse operation.

In one embodiment, each of the distances 215a and 215b are approximately about ⅜ inch. In another example, each of the distances 215a and 215b can be approximately about .2 inches or greater so long as the rinse fluid main stream cannot substantially contact top and bottom brushes 204a and 204b. It must be noted by one of ordinary skill in the art, however, that the distances 215a and 215b are dependent on hardware limitations. As such, in another embodiment, the distances 214a and 215b can be defined to be any suitable distance so long as the rinse fluid main stream is prevented from being applied onto top and bottom brushes 204a and 204b.

In accordance with one embodiment, internal diameters of top and bottom rinse nozzles 216a and 216b can be between approximately about 1/16 inch and ⅜ inch, and a more preferred range of approximately about ⅛ and ¼ inch, and most preferably approximately about ⅛ inch.

Furthermore, in one implementation, the flow rate of the rinse fluid 207 can be between approximately about 0.5 and 2 liters/minute, and a more preferred range of approximately about 0.7 and 1.5 liter/minutes, and most preferably approximately about 1 liter/minute during the rinse operation. In another embodiment, the flow rate of scrubbing fluid 207 can be between approximately about 0.3 and 1.5 liters/minute, and a more preferred range of approximately about 0.5 and 1.0 liter/minutes, and most preferably approximately about 0.7 liter/minute during the scrubbing operation.

In one example, the wafer 102 can be configured to rotate between approximately about 100 RPMs and 400 RPMs, and a more preferred range of approximately about 200 and 300 RPMs and most preferably approximately about 250 RPMs during the rinse operation.

Figure 3C:
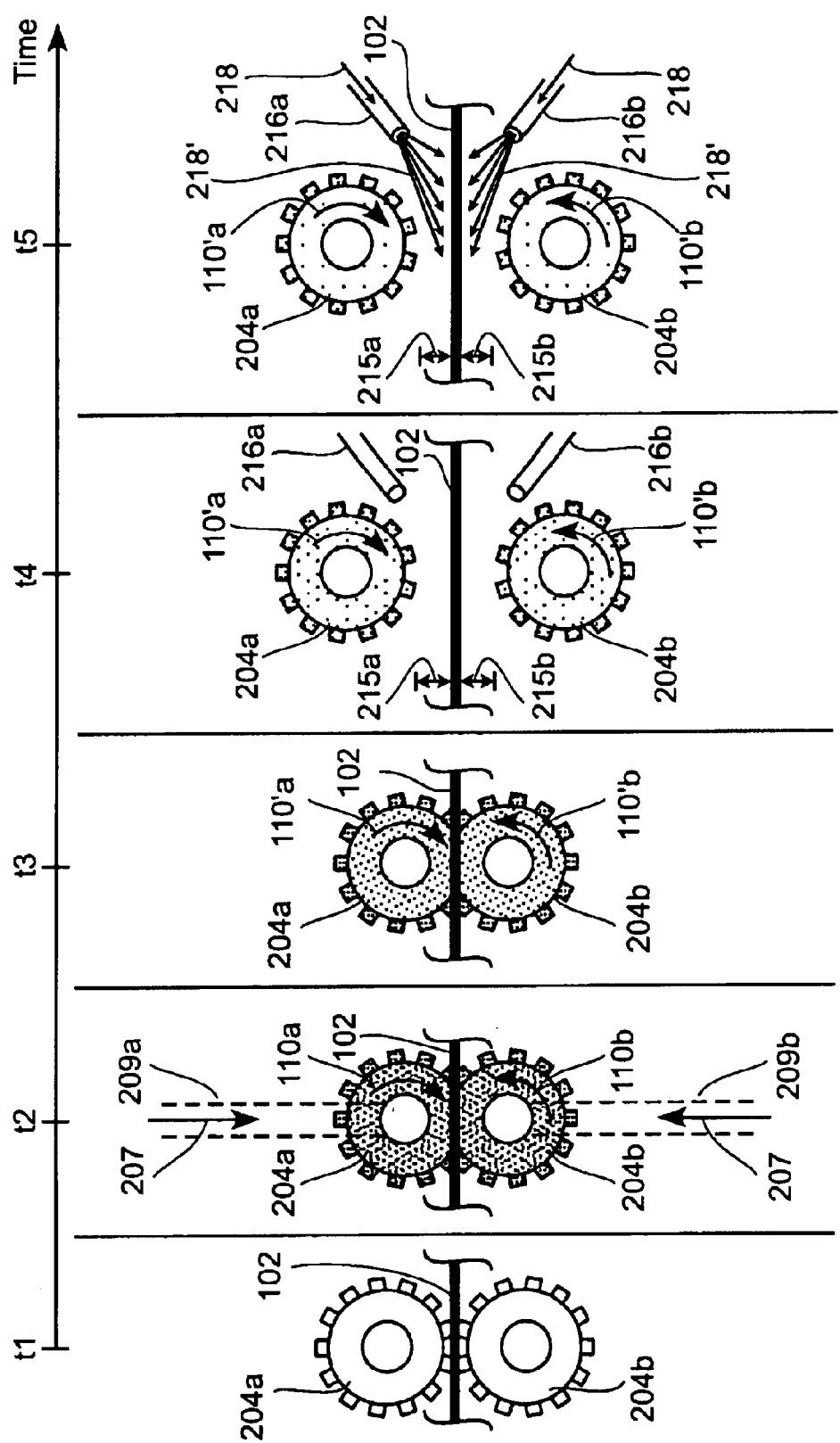
FIG. 3C is a simplified cross sectional view depicting different stages of an exemplary scrubbing-rinse operation as performed in an exemplary scrubber-rinse module, in accordance with still another embodiment of the present invention.

Reference is made to FIG. 3C depicting different stages of an exemplary scrubbing-rinse operation, as performed in an exemplary scrubber-rinse module, in accordance with one embodiment of the present invention. As shown, at time t0, top and bottom brushes 204a and 204b are respectively shown to be contacting top and bottom surfaces of the wafer 102. At this point, the scrubbing operation has not yet been initiated. Proceeding to time t1, top and bottom brushes 204a and 204b saturated with the scrubbing fluids 207a and 207b are shown to be scrubbing top and bottom surfaces of the wafer 102, correspondingly. As can be seen, scrubbing fluids 207a and 207b are fed to top and bottom brushes, respectively, through the corresponding inlets 209a and 209b.

At time t2, supplying of scrubbing fluids 207a and 207b is shown to have ceased and the squeezing operation has been initiated. As shown, while rotating in the rotation direction 110a and 110b, respectively, top and bottom brushes 204a and 204b are applied to top and bottom surfaces of the wafer 102. In this manner, excess scrubbing fluids 207a and 207b are squeezed out of top and bottom brushes 204a and 204b.

At time t3, top and bottom brushes 204a and 204b are shown to have been moved away from corresponding wafer top and bottom surfaces such that top and bottom brushes 204a and 204b are no longer in contact with top and bottom surfaces of the wafer 102. The top brush 204a has been moved above the top surface of the wafer 102 such that a distance 215a has been created between the lowermost portion of the top brush 204a and the wafer top surface. In a like manner, the bottom brush 204b is moved below the bottom surface of the wafer 102 for a distance 215b. As shown, the topmost portion of the bottom brush 204b is shown to have a distance 215b from the wafer bottom surface.

As can be appreciated, the top brush 204a is rotating in rotation direction 110a'. In this manner, any scrubbing fluid 207a collected at the lowermost portion of the top brush 204a is prevented from being dripped onto the top surface of the wafer 102. As can be seen, while both top and bottom brushes 204a and 204b are moved away for the respective distance of 215a and 215b, in this embodiment, the top brush 204a is shown to be rotating. As can be appreciated, in one example, any scrubbing fluid 207 collected at the lowermost portion of the bottom brush 204b may not be dripped onto the wafer bottom surface. As such, in this example, the bottom brush can be configured to remain stationary during rinse operation.

Continuing to time t4, the rinse fluid 218 is shown to have been introduced onto wafer top and bottom surfaces using respective top and bottom rinse nozzles 216a and 216b. The rinse fluid spray stream 218' is shown to be directed onto the respective centers of wafer top and bottom surfaces such that the rinse fluid main stream 217 cannot be sprayed onto top and bottom brushes 204a and 204b. Thus, by defining top and bottom rinse nozzles 216a and 216b such that the rinse fluid main stream is prevented from coming into contact with top and bottom brushes 204a and 204b, the concentration of the scrubbing fluids 207a and 207b can remain substantially consistent. This ensues as there does not exist a need to flush out the scrubbing fluid out of top and bottom brushes 204a and 204b prior to performing the rinse operation. Furthermore, the rinse fluid 218 cannot come into contact with top and bottom brushes 204a and 204b so as to lower the concentration of the scrubbing fluids 207a and 207b.

In one exemplary embodiment, the brush squeeze operation can be performed between approximately about 3 and 20 seconds, and a more preferred range of approximately about 3 and 15 seconds and most preferably approximately about 7 seconds. In this manner, a brush scrubbing operation can be performed between approximately about 20 and 120 seconds, and a more preferred range of approximately about 20 and 40 seconds and most preferably approximately about 30 seconds.

Figure 4A:
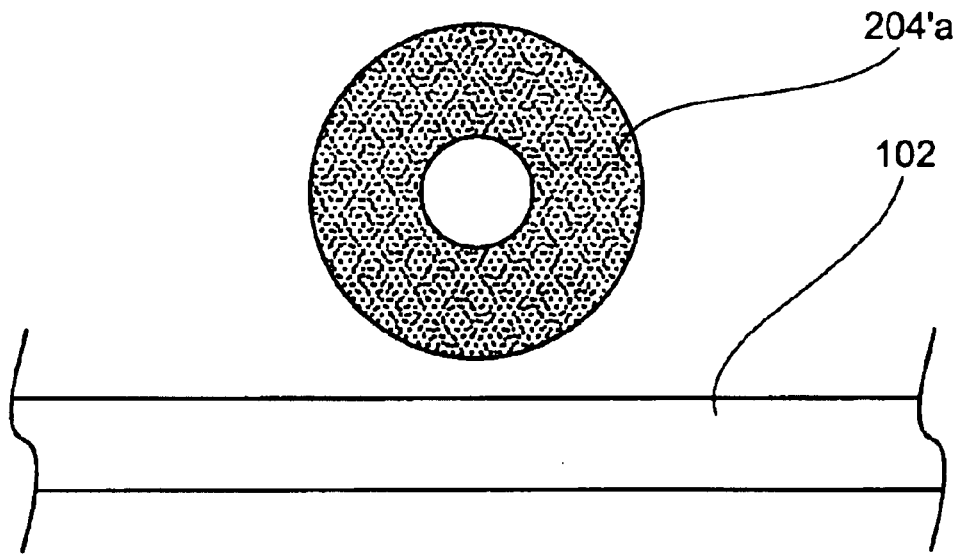
FIG. 4A is a partial, simplified, exploded, cross sectional view of a top brush of an exemplary scrubber-rinse module, in accordance with still another embodiment of the present invention.
Figure 4B:
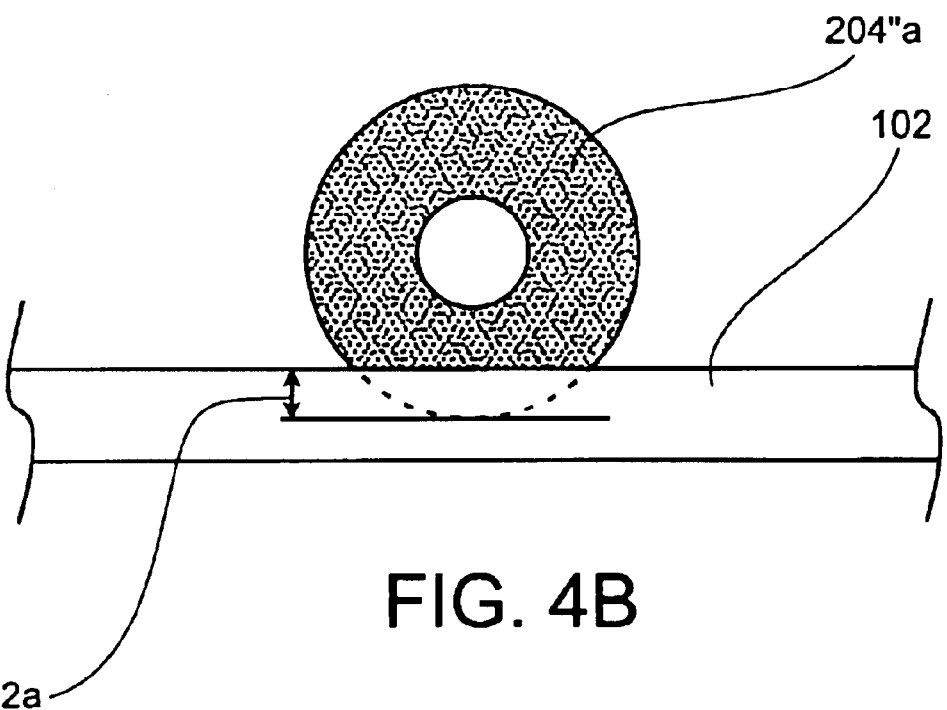
FIG. 4B is a partial, simplified, exploded, cross sectional view of the top brush shown in FIG. 4A being applied to a wafer top surface, in accordance with still another embodiment of the present invention.

Compressibility of an exemplary top brush 204a is shown in FIGS. 4A and 4B, in accordance with one embodiment of the present invention. As can be seen, the top brush 204 shown in the embodiment of FIG. 4A is not in contact with the wafer top surface. As such, the top brush 204a is not applying any pressure onto the wafer top surface. At this point, the compression of the top brush 204a is approximately about 0.

Comparatively, the top brush 204a of FIG. 4B is being applied onto the wafer top surface 102 with pressure, causing the top brush 204a to be compressed. That is, when the top brush 204a is brought into contact with the wafer top surface, the top brush 204a is compressed by certain number of millimeters. As shown in FIG. 4B, a total brush movement of the top brush 204a being applied onto the wafer top surface is approximately about distance 222a. In one example, the Tespective total brush movements of top and bottom brushes 204a and 204b are configured to range from approximately about 0 percent to approximately about 30 percent of the thickness of the corresponding top and bottom brushes 204a and 204b.

In one exemplary embodiment, each of the top and bottom brushes 204a and 204b can be configured to compress between approximately about 0 and 12 millimeters, and a more preferred range of approximately about 2 and 8 millimeters and most preferably approximately about 6 millimeters when respectively applied onto wafer top and bottom surfaces.

As can be appreciated, top and bottom brushes 204a and 204b of FIGS. 4A and 4B are flat brushes, as top and bottom brushes 204a and 204b does not include any nodules. Thus, although the embodiments of the present invention are shown to have implemented top and bottom brushes 204a and 204b having substantially the same characteristics (e.g., length, diameter, compression, etc.), in a different embodiment of the present invention, top and bottom brushes 204a and 204b may have different characteristics (e.g., be nonsymmetrical) so long as the brushes can scrub substantially the entire wafer top and bottom surfaces. In one implementation, the brush scrubber-rinse module is an asymmetric brush scrubbing system as described in U.S. application Ser. No. 10/017,109, filed on Dec. 13, 2001, having inventors Michael Ravkin, John de Larios, and Katrina Mikhaylich, and entitled "Method and Apparatus for Asymmetric Processing of Front side and Back side of Semiconductor Substrates." This U.S. Application, which is assigned to Lam Research Corporation, the assignee of the subject application, is incorporated herein by reference.

It must be noted that different top and bottom scrub fluids may be implemented to respectively scrub wafer top and bottom surfaces so long as top and bottom scrubbing fluids cannot interact with each other. In some embodiments, when wafer top and bottom surfaces are scrubbed with different scrubbing fluids, interaction between the fluids should be avoided. In a like manner, different top and bottom rinse fluids can be implemented to rinse wafer top and bottom surfaces. Similar to the scrubbing fluids, in some embodiments in which wafer top and bottom surfaces are rinsed with different rinse fluids, interaction between the fluids should be avoided.

Figure 5A:
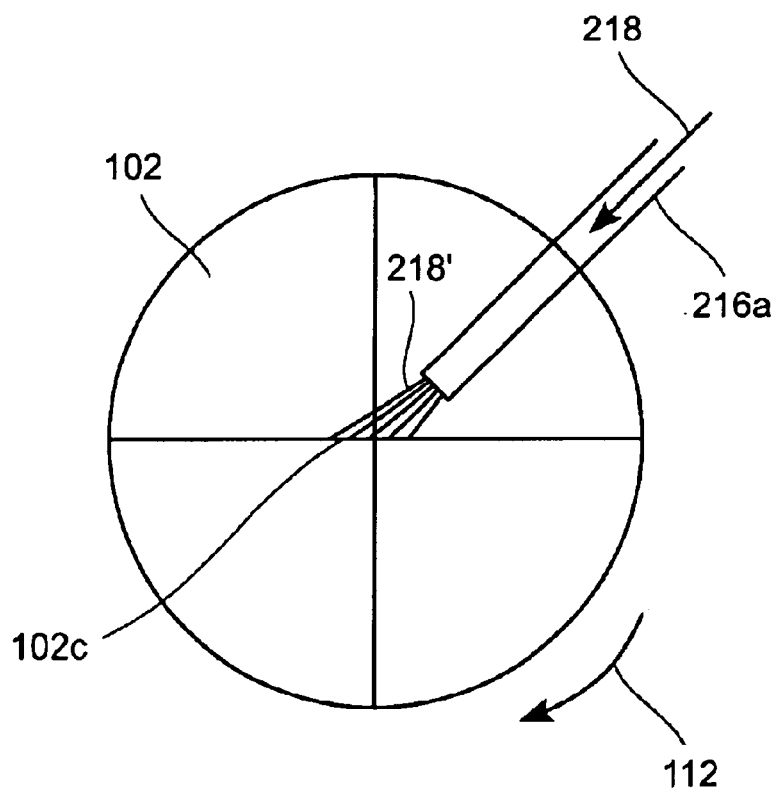
FIG. 5A is a simplified top view of the top surface of an exemplary wafer being rinsed by a rinse fluid 218, in accordance with still another embodiment of the present invention.
Figure 5B:
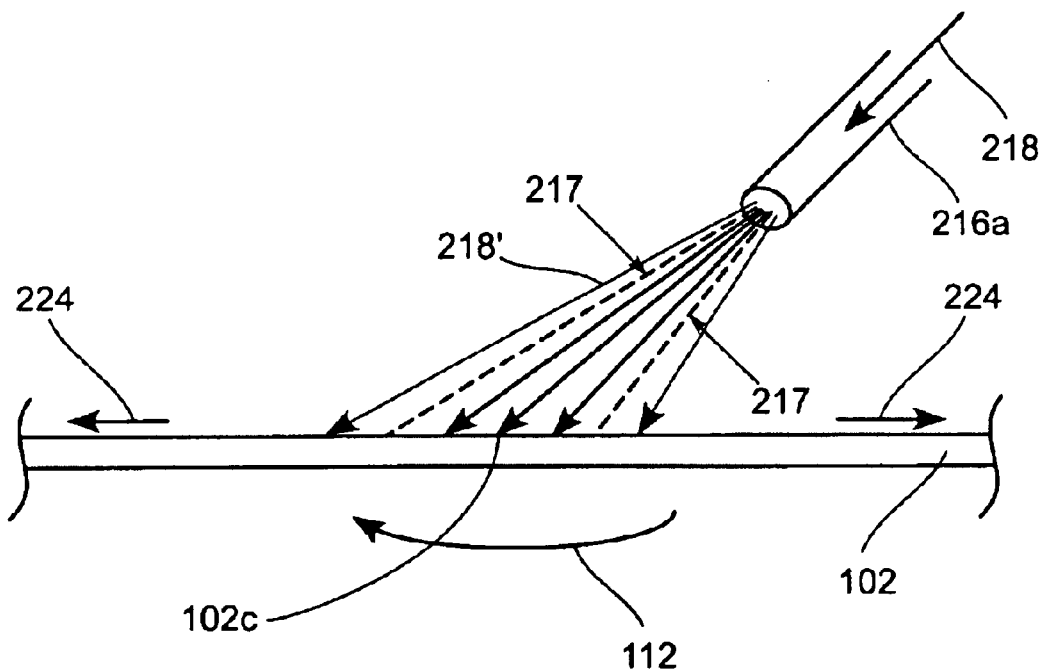
FIG. 5B is a partial, simplified, cross sectional view of the wafer shown in FIG. 5A being rinsed, in accordance with still another embodiment of the present invention.

FIG. 5A is a simplified top view of the top surface of an exemplary wafer 102 being rinsed by rinse fluid 218, in accordance with one embodiment of the present invention. FIG. 5B is a simplified, exploded, cross sectional view of the wafer 102 being rinsed, depicting the rinse fluid main stream 217 of the rinse fluid spray stream 218', in accordance with one embodiment of the present invention. As can be seen, the rinse fluid main stream 217 is directed onto a wafer center 102c through the top rinse nozzle 216a. In a preferred embodiment, as the wafer 102 rotates in the wafer rotation direction 112, the rinse fluid 218 is spread substantially evenly onto the wafer top surface in a direction 224. This occurs as a result of the centrifugal force created by the rotation of the wafer 102. In this manner, wafer top and bottom surfaces are substantially rinsed, beneficially eliminating any remaining contaminants thereon without having to introduce rinse fluid through top and bottom brushes 204a and 204b, substantially reducing overall waste in cleaning and rinse chemicals.

Figure 6A:
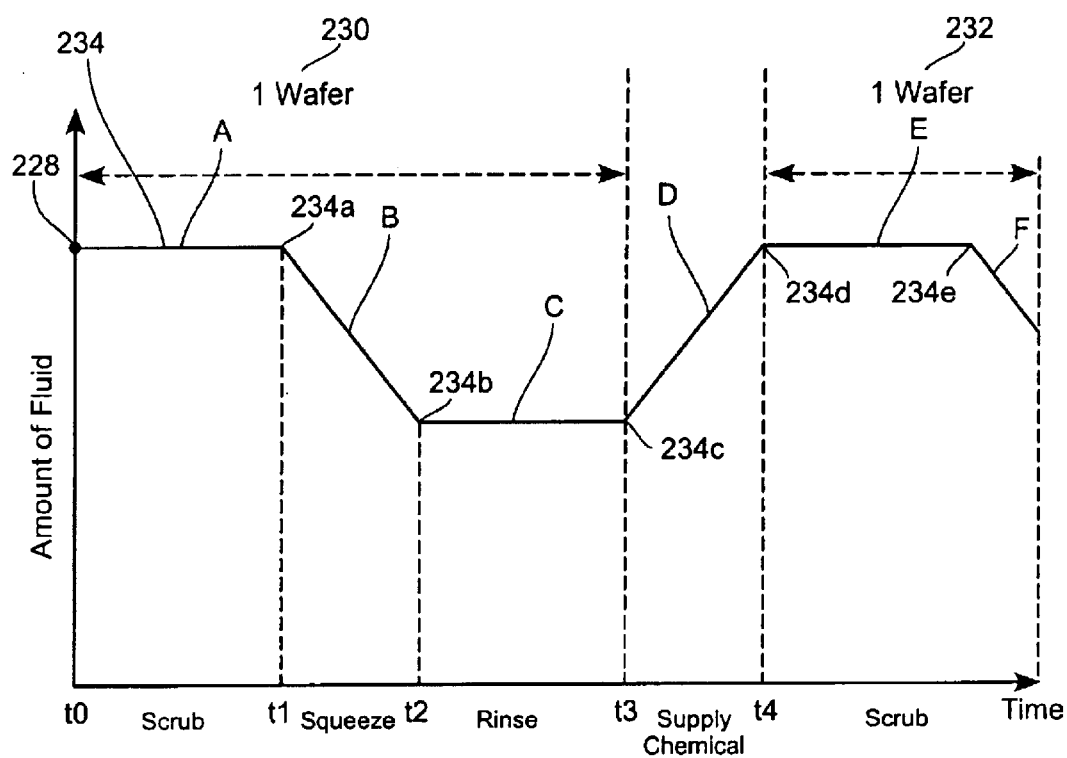
FIG. 6A is a plot illustrating changes in the amount of scrubbing fluid in, top and bottom brushes during an exemplary scrubbing-rinse operation, in accordance with still another embodiment of the present invention.

FIG. 6A is a plot illustrating a graph 234 of changes in the amount of scrubbing fluid in top and bottom brushes during an exemplary scrubbing-rinse operation, in accordance with one embodiment of the present invention. As shown, the amount of scrubbing fluid in an exemplary brush at time to is shown to be at a point 228 of the graph 234. Wafer 1 is shown to be scrubbed between the time t0 and t1 during which the amount of scrubbing fluid in the brushes is remained substantially constant, creating a substantially flat portion A of the graph 234. The substantially flat portion A also corresponds to the supplying of scrubbing fluid to the brushes and the scrubbing interface at a constant flow rate during the scrubbing operation.

Portion B of the graph 234 is shown to have taken a steep drop between times t1 and t2. This steep plunge corresponds to the squeezing operation performed during the times t1 and t2 during which supplying of scrubbing fluid to the brushes is ceased further accompanied by eliminating excess scrubbing fluid from the brushes. The portion C of the graph 234 (i.e., portion of the graph defined between points 234b and 234c of the graph 234), corresponds to the rinse operation, as performed between times t2 and t3. As shown, the portion C of the graph is substantially flat, revealing that the amount of the scrubbing fluid in the brushes remains substantially constant during the rinse operation. As discussed in more detail above, the amount of scrubbing fluid remains substantially unchanged as in one exemplary embodiment, the brushes rotate during the rinse operation, preventing any scrubbing fluid from dripping onto top and bottom surfaces of the wafer. Additionally, by directing the rinse fluid onto the wafer surfaces such that the rinse fluid main stream is directed substantially to the center of the wafer, the embodiments of the present invention prevent rinse fluid from contacting the brushes. As such, the amount of scrubbing fluid in the brushes remains substantially constant. At this point, scrubbing-rinsing of wafer 1 has concluded.

As can be seen, a portion D of the graph 234 corresponding to time t3 and t4 depicts supplying of the scrubbing fluid to the brushes to scrub the next wafer, wafer 2. As can be seen in portion D, graph 234 makes a substantially sharp climb between times t3 and t4. This sharp rise is due to supplying of fluid into the brushes for scrubbing wafer. 2. Thereafter, a portion E of the graph 234 is shown to be substantially constant between time t4–t5, correlating to the scrubbing operation, during which the amount of fluid in the brushes remains substantially constant. As further shown, a portion F of the graph 234 makes another sharp decline between time t5 and t6, correlating with the squeezing operation performed after scrubbing the wafer 2.

Figure 6B:
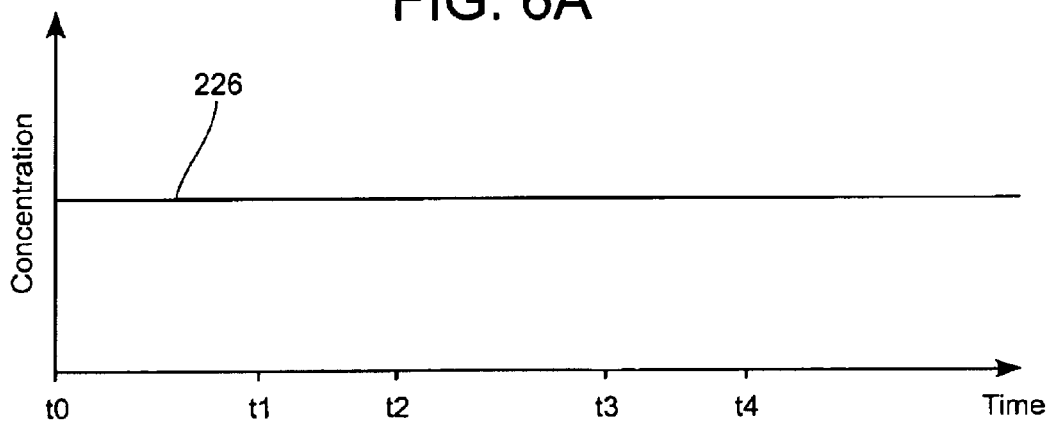
FIG. 6B is a plot illustrating the consistent concentration of scrubbing fluid in top and bottom brushes during an exemplary scrubbing-rinse operation, in accordance with still another embodiment of the present invention.

In comparison, FIG. 6B depicts a plot of concentration versus time of scrubbing fluid in an exemplary brush in an exemplary scrubber-rinse module, in accordance with one embodiment. As shown, a graph 226 is a substantially flat graph revealing the capability of the embodiments of the present invention to maintain the concentration of the scrubbing fluid constant during the scrubbing and rinse operations.

Figure 7A:
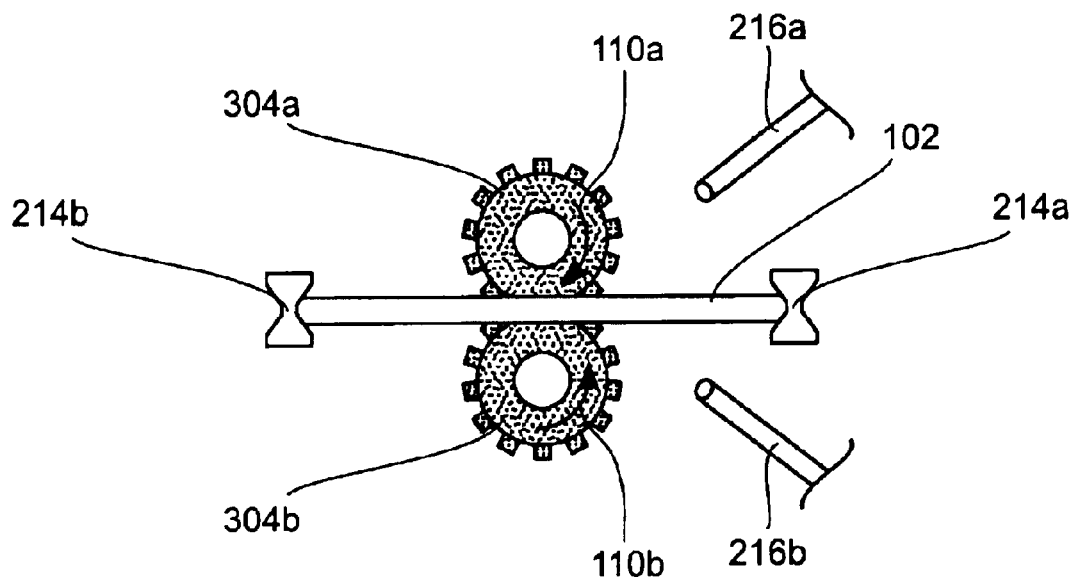
FIG. 7A is a simplified, exploded, cross sectional view depicting scrubbing of top and bottom surfaces of the wafer in an exemplary double-sided scrubber-rinse module, in accordance with still another embodiment of the present invention.
Figure 7B:
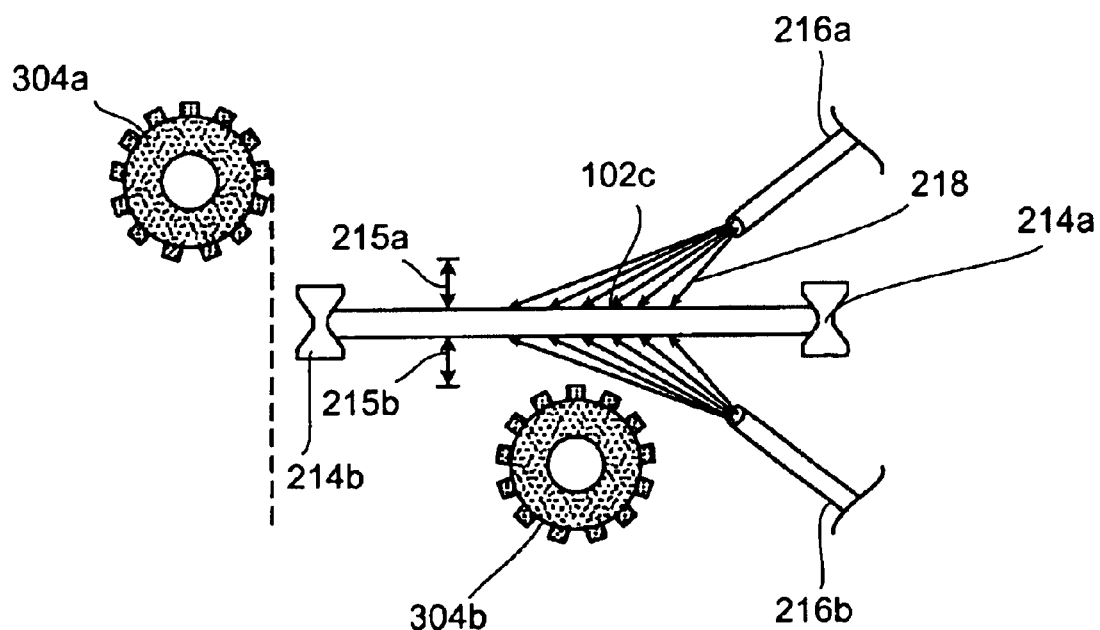
FIG. 7B is a simplified, exploded, cross sectional view depicting rinsing of top and bottom surfaces of the wafer in an exemplary double-sided scrubber-rinse module, in accordance with still another embodiment of the present invention.

Reference is made to FIGS. 7A and 7B illustrating yet another brush scrubber-rinse module, in accordance with another embodiment of the present invention. In the brush scrubber-rinse module of FIG. 7A, the wafer 102 is shown to be engaged by the two engaging rollers 214a and 214b and the driving roller 214c (not shown in this figure). Top and bottom brushes 304a and 304b saturated with the scrubbing fluid 207 are rotating in the respective rotation direction 110a and 110b, scrubbing top and bottom surfaces of the wafer 102. Then, as described in more detail above with respect to FIGS. 3A–3C, supplying of the scrubbing fluid 207 is stopped. However, top and bottom brushes 304a and 304b are applied onto top and bottom surfaces of the wafer so a to eliminate excess scrubbing liquid 207.

In the embodiment of FIG. 7B, the top brush 304a is shown to have been moved to the side of the wafer 102 such that the wafer 102 cannot be recontaminated by droplets 207' of the scrubbing liquid 207. As can be seen in the embodiment of FIG. 7B, the top brush 304a is moved to the side of both, the wafer 102 as well as the engaging roller 214b. In this manner, droplets 207' cannot be reintroduced onto the wafer top surface through the engaging roller 214b.

Although the top brush 304a is shown to have been moved to the side of the wafer, the bottom brush 304b is shown to have been lowered by the distance 215b. In one exemplary embodiment, during the rinse operation, the top brush 304a having been moved to the side of and the bottom brushes 304b are configured to remain stationary as substantially none of the droplets 207' of the scrubbing fluid 207 can come into contact with the wafer top and bottom surfaces, re-contaminating the wafer surfaces. As can be appreciated, one of ordinary skill in the art should appreciate that in another implementation, either the top brush 304a or the bottom brush 304b or both can be configured to rotate during the rinse operation. Furthermore, as can be seen, the top brush 304a is shown to have further moved up the distance 215a. However, in another embodiment, the top brush 304a may not require to be moved away from the wafer top surface.

Although symmetrical pressure is shown to be applied by top and bottom brushes 204a and 204b and 304a and 304b, it must be noted that the embodiments of the present can be implemented such that nonsymmetrical pressure is applied to top and bottom surfaces of the wafer by top and bottom brushes, respectively. Of course, it must be appreciated by one having ordinary skill in the art that nonsymmetrical pressure can be applied so long as application of nonsymmetrical pressure does not result in breaking of the wafer.

Figure 8A:
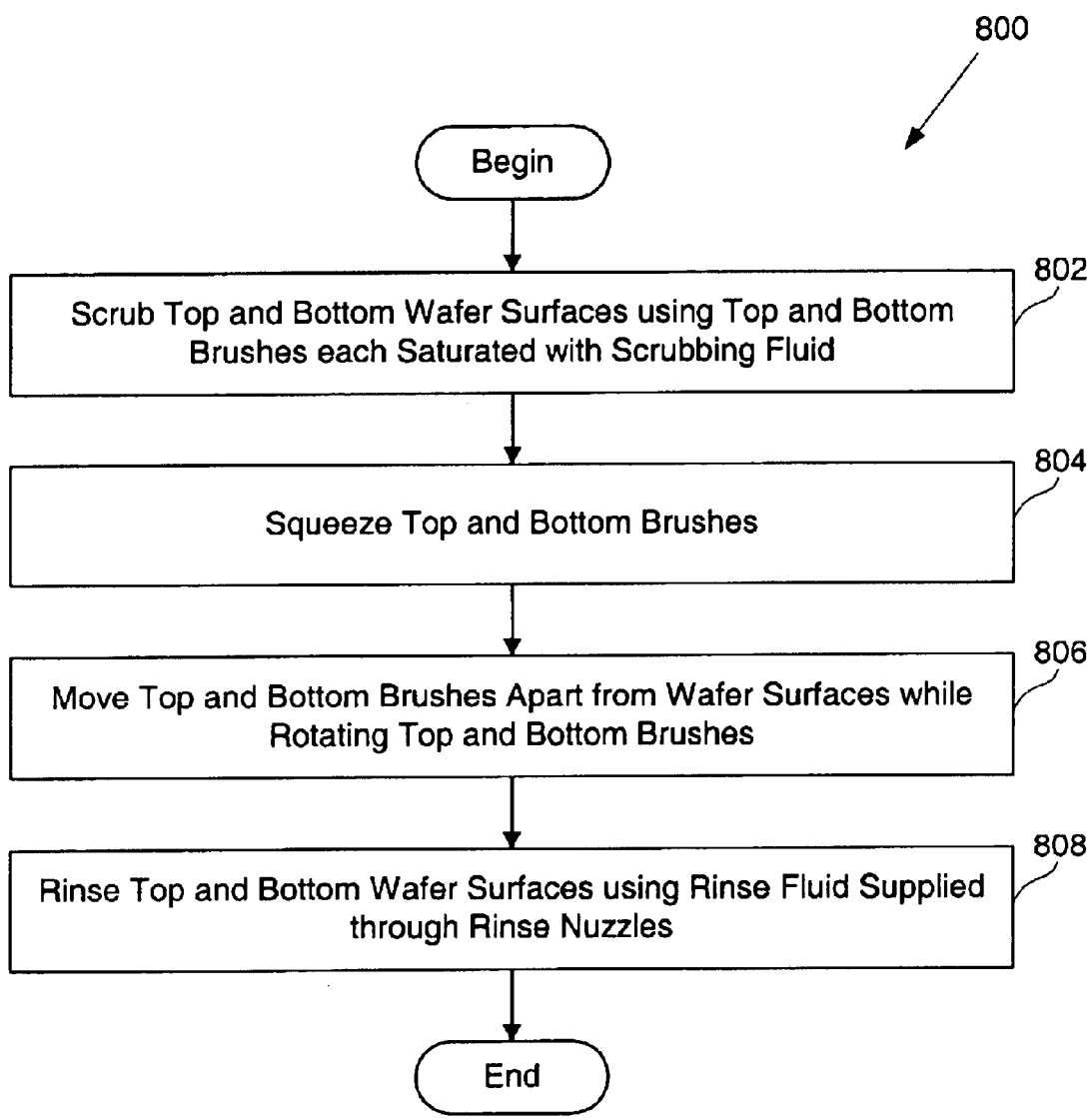
FIG. 8A is a flow chart diagram illustrating the method operations performed in an exemplary scrubber-rinse module, in accordance with another embodiment of the present invention.

Reference is made to a flowchart 800 of FIG. 8A depicting method operations performed in an exemplary scrubber-rinse module, in accordance with one embodiment of the present invention. The method begins in operation 802 in which top and bottom surfaces of the wafer are scrubbed using top and bottom brushes. Top and bottom brushes are configured to be saturated with scrubbing fluid. The method then continues to operation 804 in which top and bottom brushes are squeezed. Proceeding to operation 806, top and bottom brushes are respectively moved away from top and bottom surfaces of the wafer while top and bottom brushes are rotating. Next, in operation 808, top and bottom wafer surfaces are rinsed using the rinse fluid that is supplied through rinse nozzles.

Figure 8B:
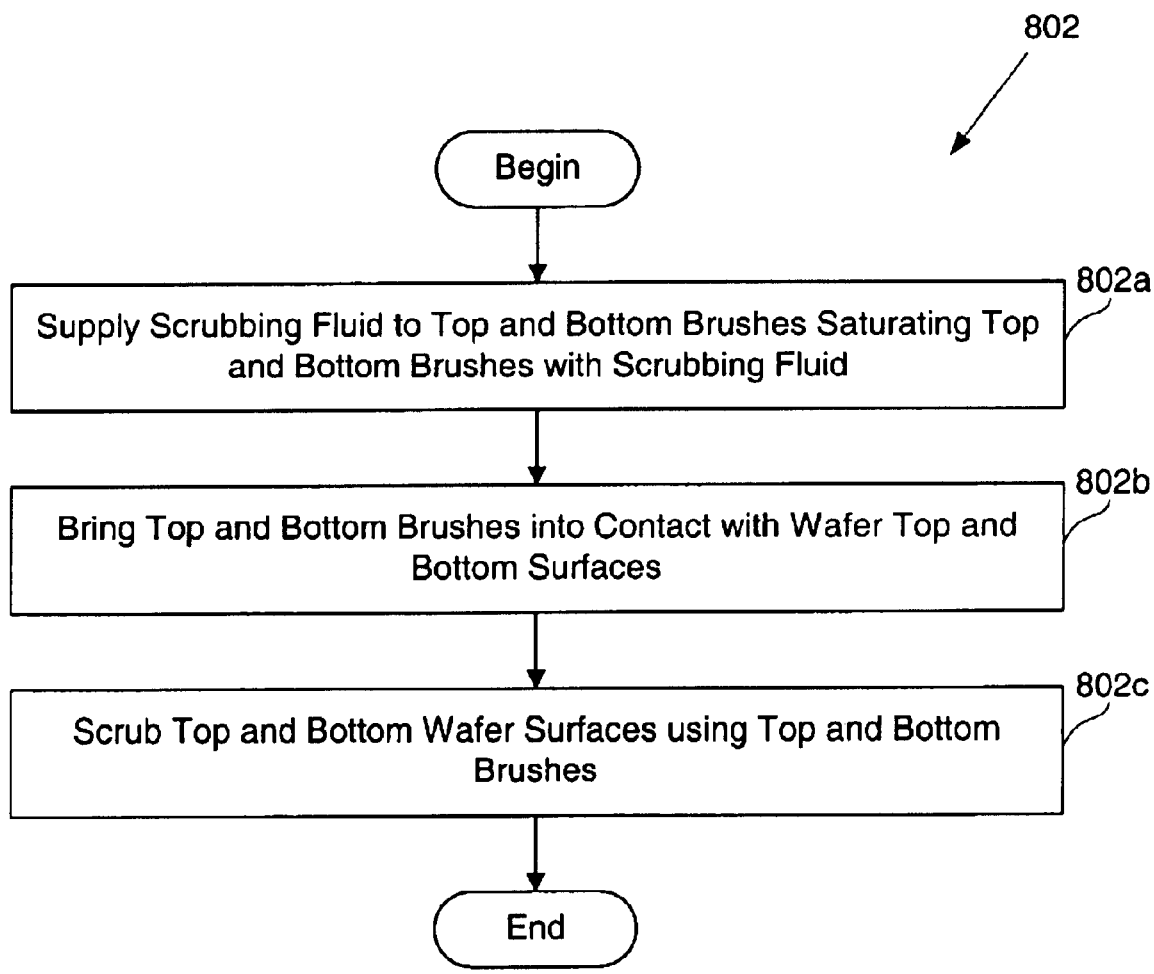
FIG. 8B is a flow chart diagram illustrating the method operations implemented during the scrubbing operation of FIG. 8A, in accordance with another embodiment of the present invention.

With reference to the method operation of FIG. 8B, operation 802 can further be understood. Starting in operation 802a, scrubbing fluid is supplied to top and bottom brushes so as to saturate top and bottom brushes. Then, in operation 802b, top and bottom brushes are brought into contact with wafer top and bottom surfaces, respectively. Next, in operation 802c, top and bottom surfaces of the wafer are scrubbed using top and bottom brushes.

Figure 8C:
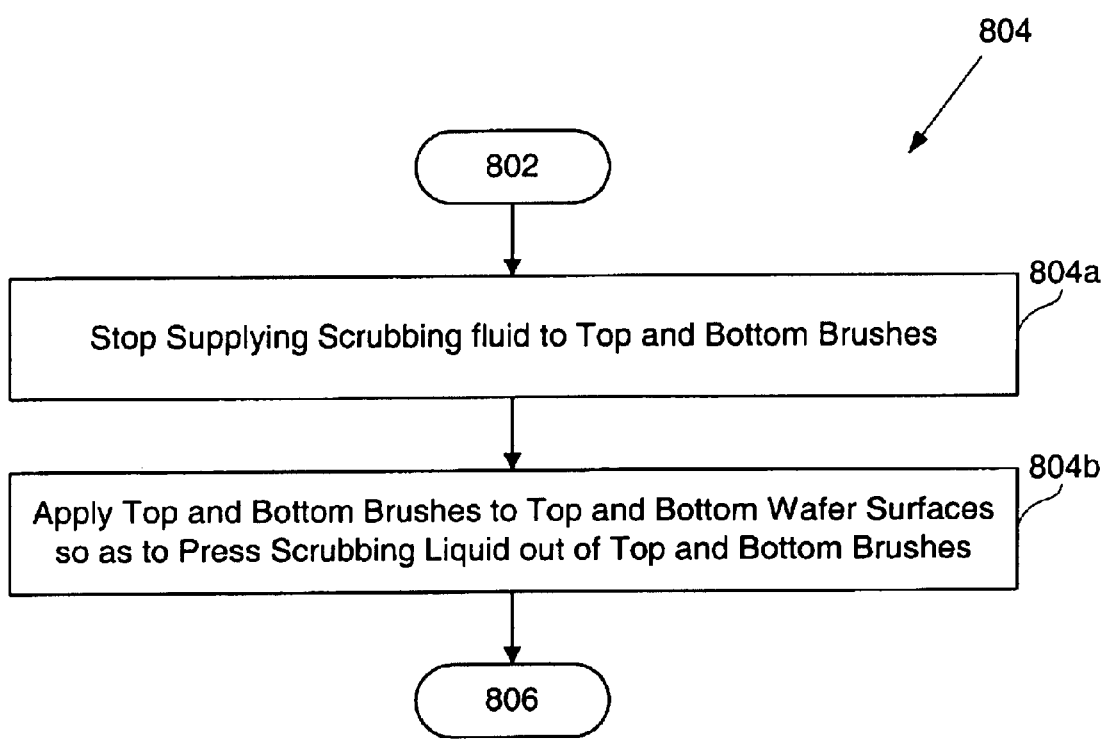
FIG. 8C is a flow chart diagram illustrating the method operations implemented during the squeezing operation of FIG. 8A, in accordance with another embodiment of the present invention.

Operation 804 can further be understood with reference to method operation depicted in FIG. 8C, in accordance with one embodiment of the present invention. In operation 804a, supplying of the scrubbing fluid to top and bottom brushes is stopped. Proceeding to operation 804b, top and bottom brushes are applied to top and bottom wafer surfaces, respectively. The scrubbing fluid is pressed out of top and bottom brushes preventing excess scrubbing fluid from dripping onto wafer top and bottom surfaces. In this manner, top and bottom surfaces of the wafer may not be re-contaminated. Beneficially, the amount of scrubbing fluid implemented is minimized while top and bottom brushes are maintained saturated with scrubbing fluid substantially at all times.

Figure 8D:
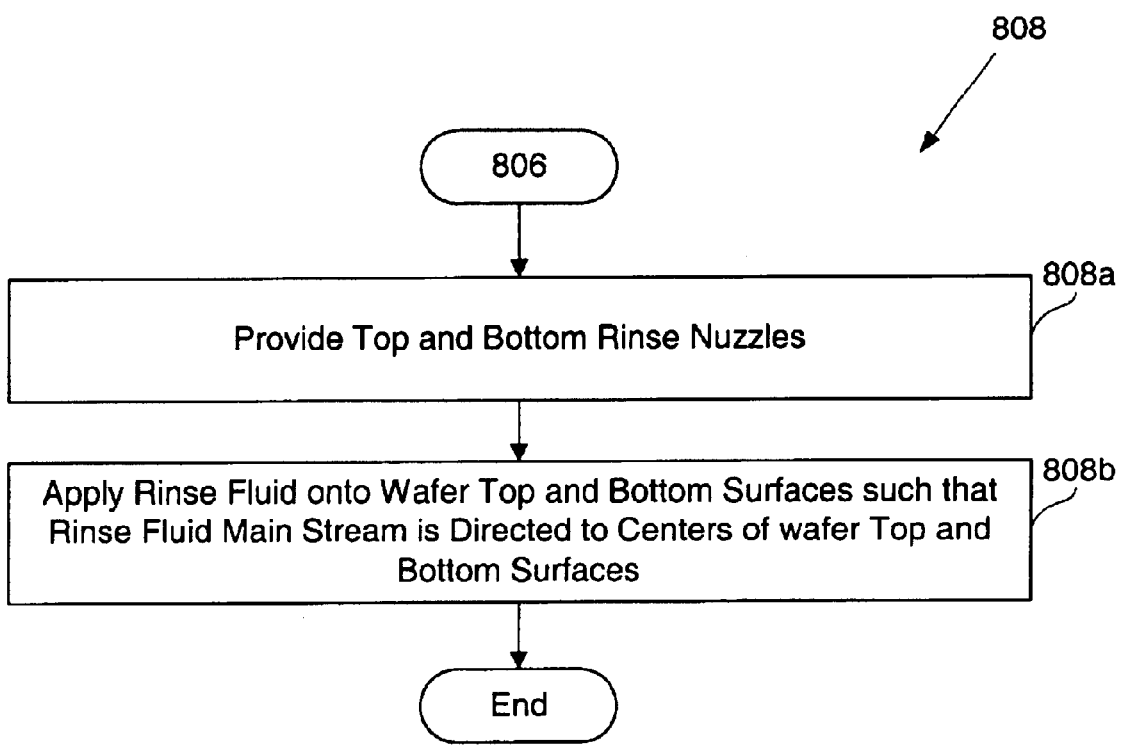
FIG. 8D is a flow chart diagram illustrating the method operations implemented during the rinse operation of FIG. 8A, in accordance with another embodiment of the present invention.

With reference to method operation depicted in FIG. 8D, operation 808 can further be understood. In operation 808a, top and bottom rinse nozzles are provided. Then, in operation 808b, rinse fluid is applied onto wafer top and bottom surfaces. Rinse fluid is applied such that rinse fluid main stream is directed to respective centers of top and bottom surfaces of the wafer. In this manner, beneficially, the concentration of scrubbing fluid in top and bottom brushes is remained substantially constant due to rinse fluid being prevented from diluting the concentration of the scrubbing fluid. Furthermore, in this manner, the rinse operation can be performed without having to first rinse out the brushes.

Figure 9:
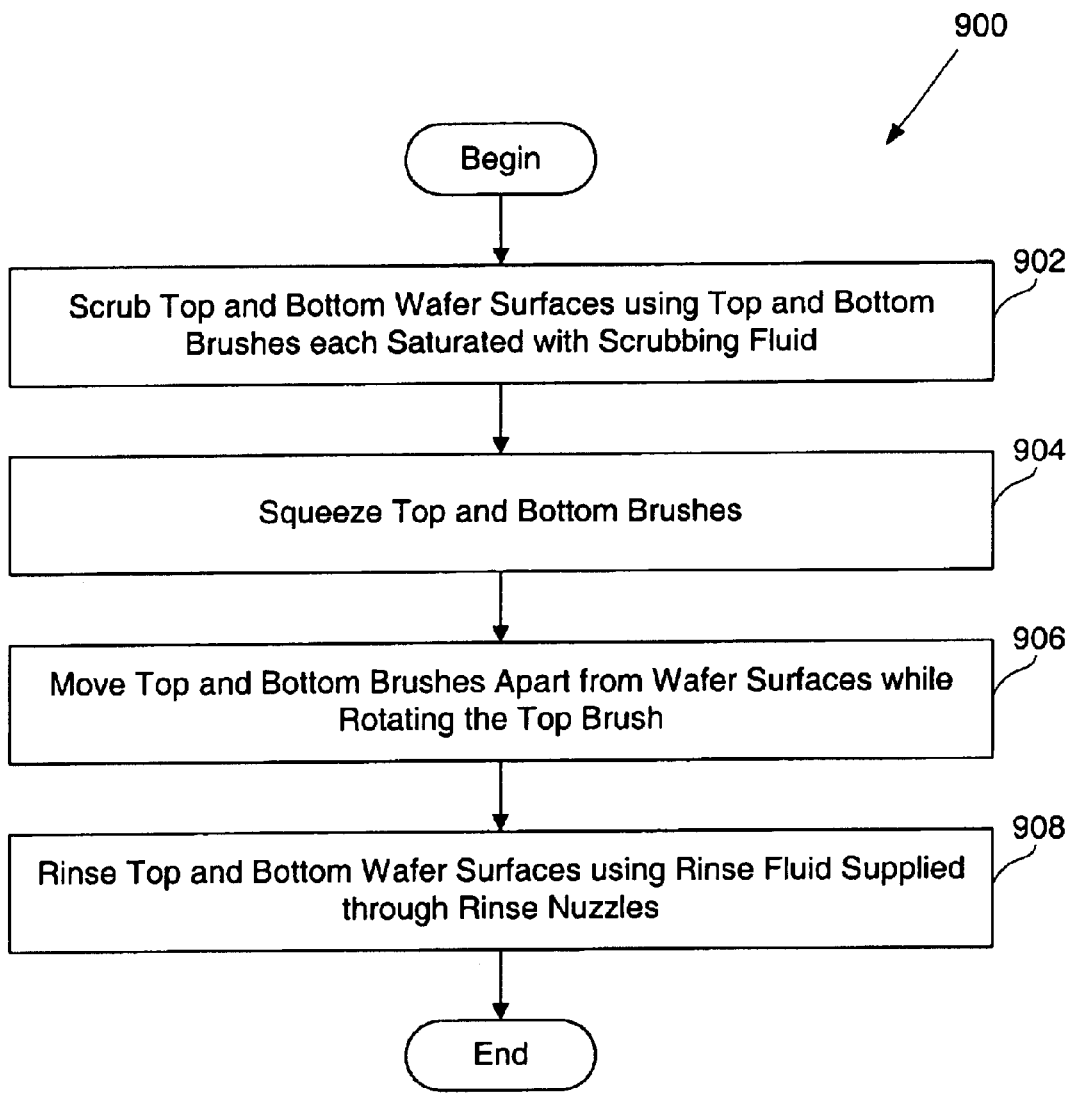
FIG. 9 is a flowchart diagram illustrating method operations performed in another exemplary scrubber-rinse module, in accordance with yet another embodiment of the present invention.

Reference is made to flowchart 900 depicted in FIG. 9 illustrating method operations performed in another exemplary scrubber-rinse module, in accordance with one embodiment of the present invention. The method begins in operation 902 in which top and bottom wafer surfaces are scrubbed using top and bottom brushes, respectively. The brushes are saturated with scrubbing fluid. Then, in operation 904, the brushes are squeezed. In one example, the brushes are squeezed by applying the brushes onto top and bottom surfaces of the wafer. In operation 906 the top brush is moved away from the wafer top surface while the top brush is rotating. The bottom brush is also moved away from the wafer bottom surface. Then, top and bottom wafer surfaces are rinsed using rinse fluid supplied through rinse nozzles.

Figure 10:
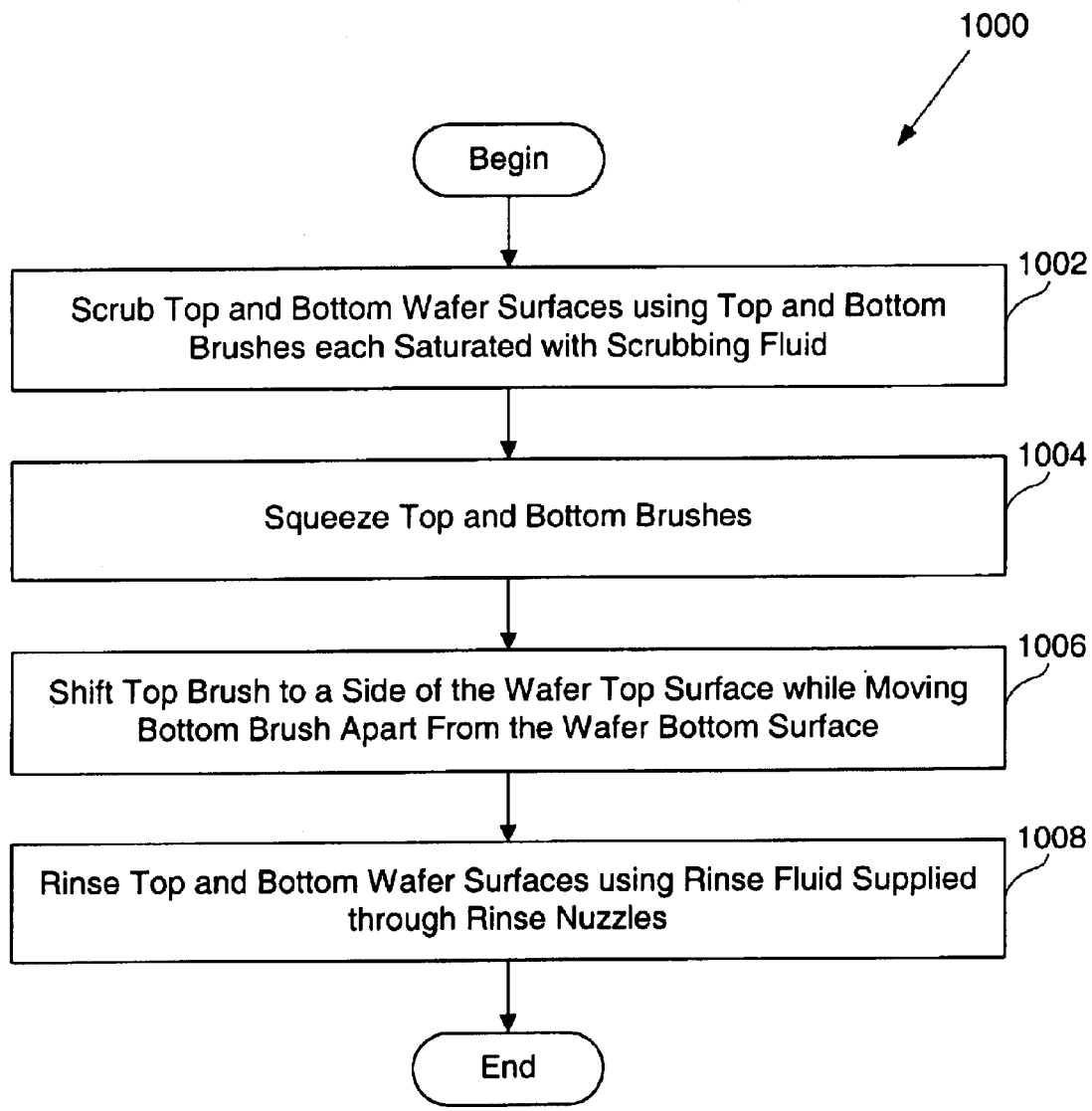
FIG. 10 is a flowchart diagram illustrating method operations performed in another exemplary scrubber-rinse module, in accordance with still another embodiment of the present invention.

FIG. 10 depicts a flowchart diagram 1000 illustrating method operation performed by yet another scrubber-rinse module, in accordance with another embodiment of the present invention. The method begins in operation 1002 in which top and bottom wafer surfaces are scrubbed using top and bottom brushes. Top and bottom brushes are saturated with scrubbing fluid. Next, in operation 1004, top and bottom brushes are squeezed followed by operation 1006 in which the top brush is shifted to the side of the wafer top surface while the bottom brush is moved away from the wafer bottom surface. Continuing to operation 1008, top and bottom wafer surfaces are rinsed using rinse fluid supplied through rinse nozzles.

In one exemplary embodiment, the brush scrubber-rinse module of the present invention can be implemented in a clustered wafer cleaning apparatus that may be controlled in an automated way by a cleaning control station. For instance, the clustered cleaning apparatus may include a sender station, a scrubber-rinse module, a spin-rinse and dry (SRD) station, and a receiver station. Broadly stated, wafers initially placed in the sender station are delivered, one-at-a-time, to the cleaning station. After being scrubbed and rinsed in the scrubber-rinse module, the wafers are dried in the SRD module. The wafers are then delivered to the receiver station for being stored temporarily. One of ordinary skill in the art must appreciate that in one embodiment, the clustered cleaning apparatus can be implemented to carry out a plurality of different substrate preparation operations (e.g., cleaning, etching, buffing, etc.).

Although the foregoing invention has been described in some detail for purposes of clarity of understanding, it will be apparent that certain changes and modifications may be practiced within the scope of the appended claims. For example, although the following parameters are associated with an exemplary "300 mm wafer," the parameters may be modified for application to substrates of varying sizes and shapes such as those employed in the manufacture of semiconductor devices and flat panel displays, hard drive discs, flat panel displays, and the like. Additionally, the present embodiments are to be considered as illustrative and not restrictive, and the invention is not to be limited to the details given herein, but may be modified within the scope and equivalents of the appended claims.

What is claimed is:

1. A method for cleaning top and bottom surfaces of a semiconductor substrate, comprising:

scrubbing a top surface of the semiconductor wafer with a top brush and a bottom surface of the semiconductor substrate with a bottom brush, the top brush and the bottom brush being saturated and supplied with a scrubbing fluid;

squeezing the top brush and the bottom brush so as to press out excess scrubbing fluid by continuing to apply the top brush against the top surface and the bottom brush against the bottom surface of the semiconductor substrate, but without supplying the scrubbing fluid;

moving the top brush away from the top surface of the semiconductor substrate and the bottom brush from the bottom surface of the semiconductor substrate;

rotating the top brush to prevent dripping onto the top surface of the semiconductor substrate; and rinsing the top and bottom surfaces of the semiconductor substrate using a rinse fluid while continuing to rotate the top brush, which was squeezed to press out the excess scrubbing fluid.

2. A method as recited in claim 1, wherein the operation of scrubbing the top surface and bottom surface of the semiconductor substrate includes, supplying the scrubbing fluid to the top brush and the bottom brush;

bringing the top brush into contact with the top surface of the semiconductor substrate and the bottom brush with the bottom surface of the semiconductor substrate; and applying the top brush against the top surface of the semiconductor substrate and the bottom brush against the bottom surface of the semiconductor substrate while rotating the top brush in a first rotation direction and the bottom brush in a second rotation direction.

3. A method as recited in claim 1, wherein the operation of squeezing the top brush and the bottom brush includes, stopping the supplying of scrubbing fluid to the top brush and the bottom brush; and applying the top brush against the top surface of the semiconductor substrate and the bottom brush against the bottom surface of the semiconductor substrate while rotating the top brush in a first rotation direction and the bottom brush in the second rotation direction, the applying configured to press out excess scrubbing fluid from the top brush and the bottom brush.

4. A method as recited in claim 1, wherein the operation of rinsing the top and bottom surfaces of the semiconductor substrate includes, supplying rinse fluid to a top rinse nozzle and a bottom rinse nozzle; and applying rinse fluid onto a center of the top surface of the semiconductor substrate and a center of the bottom surface of the semiconductor substrate.

5. A method as recited in claim 4, wherein the top surface and bottom surface of the semiconductor wafer are rinsed such that a main stream of the rinse fluid is directed onto respective centers of the top and bottom surfaces of the semiconductor substrate.

6. A method as recited in claim 1, wherein the top brush is moved away from the top surface of the semiconductor substrate for a top distance and the bottom brush is moved away from the bottom surface of the substrate for a bottom distance.

7. A method as recited in claim 1 wherein the top distance and the bottom distance are defined such that a main stream of the rinse fluid is applied onto respective centers of the top and bottom surfaces of the semiconductor substrate without substantially contacting the top brush and the bottom brush.

8. A method as recited in claim 1, the method further comprising:

rotating the bottom brush to prevent dripping onto the bottom surface of the semiconductor substrate.

9. A method for cleaning a semiconductor substrate, comprising:

scrubbing a top surface of the semiconductor substrate with a top brush and a bottom surface of the semiconductor substrate with a bottom brush, the top brush and the bottom brush being saturated with a scrubbing fluid;

squeezing the top brush and the bottom brush so as to press out excess scrubbing fluid;

moving the top brush away from the top surface of the semiconductor substrate and the bottom brush from the bottom surface of the semiconductor substrate while rotating the top brush; and rinsing top and bottom surfaces of the semiconductor substrate using a rinse fluid.

10. A method as recited in claim 9, wherein the operation of scrubbing the top surface and bottom surface of the semiconductor substrate includes, supplying the scrubbing fluid to the top brush and the bottom brush;

bringing the top brush into contact with the top surface of the semiconductor substrate and the bottom brush with the bottom surface of the semiconductor substrate; and applying the top brush against the top surface of the semiconductor substrate and the bottom brush against the bottom surface of the semiconductor substrate while rotating the top brush in a first rotation direction and the bottom brush in the second rotation direction.

11. A method as recited in claim 10, wherein the operation of squeezing the top brush and the bottom brush includes, stopping the supplying of scrubbing fluid to the top brush and the bottom brush; and applying the top brush against the top surface of the semiconductor substrate and the bottom brush against the bottom surface of the substrate while rotating the top brush in a first rotation direction and the bottom brush in the second rotation direction, the applying configured to press out excess scrubbing fluid from the top brush and the bottom brush.

12. A method as recited in claim 9, wherein the top brush and the bottom brush are configured to be compressed up to approximately about 30 (thirty) percent of a thickness of the top brush and a thickness of the bottom brush.

13. A method for cleaning top and bottom surfaces of a semiconductor substrate, comprising:

scrubbing a top surface of the semiconductor substrate with a top brush and a bottom surface of the semiconductor substrate with a bottom brush, the top brush and the bottom brush being saturated and supplied with a scrubbing fluid;

squeezing the top brush and the bottom brush so as to press out excess scrubbing fluid by continuing to apply the top brush against the top surface and the bottom brush against the bottom surface of the semiconductor substrate, but without supplying the scrubbing fluid;

moving the top brush to a side of the top surface of the semiconductor substrate and moving the bottom brush away from the bottom surface of the semiconductor substrate to prevent dripping onto the top surface of the semiconductor substrate; and rinsing the top and bottom surfaces of the semiconductor substrate using a rinse fluid.

14. A method as recited in claim 13, wherein the operation of scrubbing the top surface and bottom surface of the semiconductor substrate includes, supplying the scrubbing fluid to the top brush and the bottom brush;

bringing the top brush into contact with the top surface of the semiconductor substrate and the bottom brush with the bottom surface of the semiconductor substrate; and applying the top brush against the top surface of the semiconductor substrate and the bottom brush against the bottom surface of the semiconductor substrate while rotating the top brush in a first rotation direction and the bottom brush in the second rotation direction.

15. A method as recited in claim 14, wherein the operation of squeezing the top brush and the bottom brush includes, stopping the supplying of scrubbing fluid to the top brush and the bottom brush; and applying the top brush against the top surface of the semiconductor substrate and the bottom brush against the bottom surface of the substrate while rotating the top brush in a first rotation direction and the bottom brush in the second rotation direction, the applying configured to press out excess scrubbing fluid from the top brush and the bottom brush.

16. A method as recited in claim 13, wherein the operation of rinsing the top and bottom surfaces of the semiconductor substrate includes, supplying the rinse fluid to a top rinse nozzle and a bottom rinse nozzle; and applying rinse fluid onto a center of the top surface of the semiconductor substrate and a center of the bottom surface of the semiconductor substrate.

17. A method as recited in claim 16, wherein the top surface and bottom surface of the semiconductor wafer are rinsed such that a main stream of the rinse fluid is directed onto the respective centers of the top and bottom surfaces of the semiconductor substrate.

18. A method for cleaning top and bottom surfaces of a semiconductor substrate, comprising:

scrubbing a top surface of the semiconductor wafer with a top brush and a bottom surface of the semiconductor substrate with a bottom brush, the top brush and the bottom brush being saturated with a scrubbing fluid;

squeezing the top brush and the bottom brush so as to press out excess scrubbing fluid;

moving the top brush away from the top surface of the semiconductor substrate and the bottom brush from the bottom surface of the semiconductor substrate while rotating the top brush; and rinsing the top and bottom surfaces of the semiconductor substrate using a rinse fluid.

19. A method as recited in claim 18, the method further comprising:

rotating the bottom brush to prevent dripping onto the bottom surface of the semiconductor substrate.

20. A method as recited in claim 18, wherein the top brush and the bottom brush are configured to be compressed up to approximately about 30 (thirty) percent of a thickness of the brush and a thickness of the bottom brush.

* * * * *